(12) United States Patent
Yu et al.

(10) Patent No.: US 10,614,878 B2
(45) Date of Patent: Apr. 7, 2020

(54) HIGH SPEED SRAM DEVICE WITH CROSS COUPLED BIT LINE CHARGING CIRCUIT AND VOLTAGE

(71) Applicant: Taiwan Semiconductor Manufacturing Company Limited, Hsinchu (TW)

(72) Inventors: Hua-Hsin Yu, Hsinchu (TW); Hau-Tai Shieh, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/273,745

(22) Filed: Sep. 23, 2016

(65) Prior Publication Data

US 2018/0090189 A1  Mar. 29, 2018

(51) Int. Cl.
| | | |
|---|---|---|
| *G11C 11/419* | (2006.01) | |
| *G11C 7/12* | (2006.01) | |
| *G11C 7/10* | (2006.01) | |
| *G11C 11/4074* | (2006.01) | |
| *G11C 11/4091* | (2006.01) | |
| *G11C 7/06* | (2006.01) | |
| *G11C 11/4094* | (2006.01) | |

(52) U.S. Cl.
CPC .......... *G11C 11/419* (2013.01); *G11C 7/1096* (2013.01); *G11C 7/12* (2013.01); *G11C 7/065* (2013.01); *G11C 11/4074* (2013.01); *G11C 11/4091* (2013.01); *G11C 11/4094* (2013.01)

(58) Field of Classification Search
CPC ..... G11C 7/20; G11C 11/419; G11C 11/4074; G11C 7/065; G11C 7/067; G11C 7/062; G11C 11/4091
See application file for complete search history.

(56) References Cited

U.S. PATENT DOCUMENTS

| | | | | |
|---|---|---|---|---|
| 5,864,511 A | * | 1/1999 | Sato | ....................... G11C 11/419 |
| | | | | 365/154 |
| 6,031,779 A | * | 2/2000 | Takahashi | ................. G11C 7/06 |
| | | | | 365/189.09 |
| 2002/0195678 A1 | * | 12/2002 | Watanabe | ............... G11C 7/065 |
| | | | | 257/500 |
| 2009/0073782 A1 | * | 3/2009 | Hanafi | .................... G11C 29/02 |
| | | | | 365/189.09 |
| 2015/0063007 A1 | * | 3/2015 | Choi | ..................... G11C 11/419 |
| | | | | 365/154 |
| 2015/0098267 A1 | * | 4/2015 | Jain | .......................... G11C 7/12 |
| | | | | 365/154 |
| 2016/0189759 A1 | * | 6/2016 | Kim | ......................... G11C 7/12 |
| | | | | 365/72 |

* cited by examiner

*Primary Examiner* — Jerome Leboeuf
(74) *Attorney, Agent, or Firm* — Jones Day

(57) ABSTRACT

A module includes a high speed voltage node, a pre-charging circuit, and a cross coupled circuit. The pre-charging circuit includes a pre-charger configured to pre-charge complementary first and second lines of a memory device to a level of a source voltage. The cross coupled circuit is configured to pull one of the first and second lines to a level of a high speed voltage at the high speed voltage node higher than the level of the source voltage. As such, a memory cell of the memory device can be read at a high speed.

19 Claims, 17 Drawing Sheets

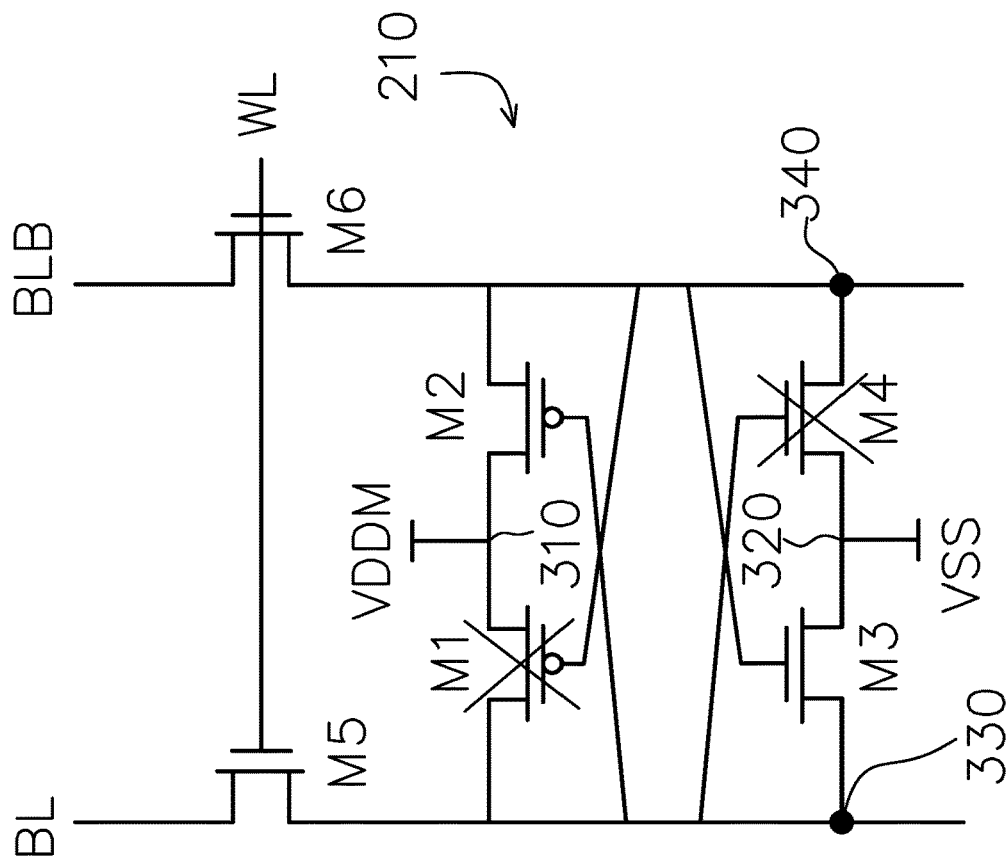
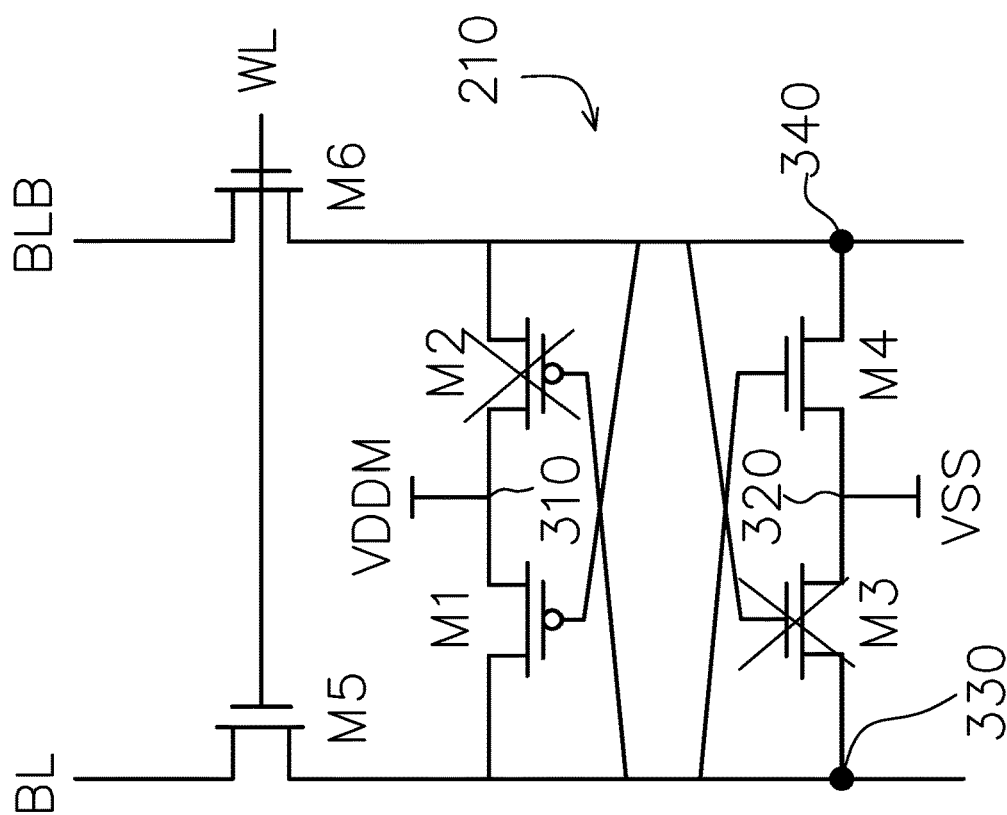

HIGH SPEED SRAM DEVICE WITH CROSS COUPLED BIT LINE CHARGING CIRCUIT AND VOLTAGE

BACKGROUND

A conventional memory device includes a memory cell, complementary first and second lines, a pre-charging circuit, and a sensing circuit. Prior to a read operation of the memory device, the pre-charging circuit pre-charges the first and second lines to a high voltage level. Thereafter, the first and second lines are left floating at the high voltage level.

During a read operation of the memory device, bits '0' and '1' of data stored in the memory cell are respectively transferred to the first and second lines. This pulls the first line towards a low voltage level and keeps the second line at the high voltage level. When the sensing circuit senses a difference between levels of voltages on the first and second lines exceeds a threshold level, the sensing circuit pulls the first line to the low voltage level, whereby complementary bits of the data are read from the memory cell. Such a read operation is relatively slow.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A and 4B are schematic circuit diagrams of the memory cell during a read/write operation of the memory device according to some embodiments.

DETAILED DESCRIPTION

Figure 1:
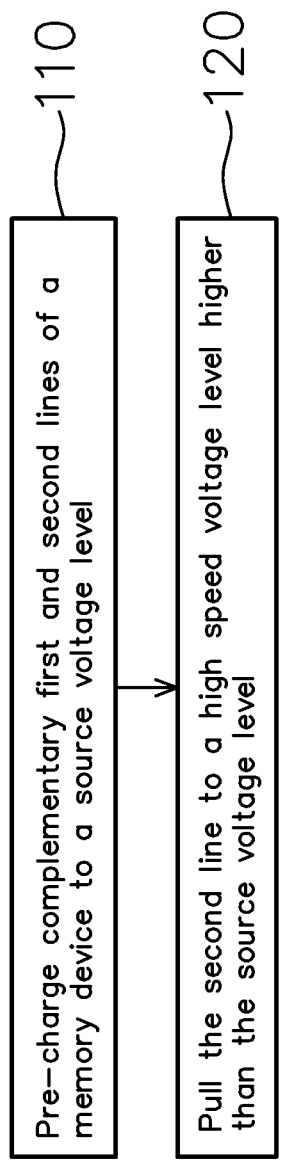
FIG. 1 is a flow chart of an exemplary method of performing a read/write operation in a memory device according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a memory device that includes a memory cell, complementary data lines, a sensing circuit, and a cross coupled circuit. As will be described in detail therein, the cross coupled circuit facilitates the sensing circuit to quickly sense a difference between levels of voltages on the data lines, whereby the memory cell can be read at a high speed.

A flow chart of an exemplary method of performing a read/write operation in a memory device, according to some embodiments, is illustrated in FIG. 1. The memory device includes a memory cell, complementary first and second lines, a pre-charging circuit, a voltage generating circuit, and a cross coupled circuit. In operation 110, a pre-charger of the pre-charging circuit pre-charges the first and second lines to a source voltage level, e.g., a level of a source voltage at which the pre-charger is operated. In some embodiments, at substantially the same time as operation 110, an equalizer of the pre-charging circuit equalizes levels of voltages on the first and second lines. In other embodiments, prior to operation 110, the equalizer equalizes levels of voltages on the first and second lines.

In operation 120, the cross coupled circuit pulls the second line to a high speed voltage level higher than the source voltage level, whereby bits of data are read/written from/to the memory cell. In some embodiments, operation 120 includes electrically coupling the second line to a high speed voltage node of the voltage generating circuit, to which a high speed voltage generated by the voltage generating circuit is applied, using a cross-coupled transistor pair of the cross coupled circuit and varying a threshold voltage of a transistor of the cross-coupled transistor pair. In other embodiments, operation 120 includes electrically coupling the second line to the high speed voltage node using a cross-coupled transistor pair of the cross coupled circuit and respectively turning on and off a pair of transistors of the cross-coupled transistor pair.

In some embodiments, the method further includes electrically and respectively connecting the first and second lines to complementary data lines of the memory device and, at substantially the same time as operation 120, pulling one of the data lines to a low voltage level, e.g., a level of a reference voltage of the memory device, whereby complementary bits of data are read from the memory cell. In other embodiments, the method further includes electrically and respectively connecting the first and second lines to complementary local bit lines of the memory device and, at substantially the same time as operation 120, pulling the first line to the low voltage level, whereby complementary bits of data are read from the memory cell.

Figure 2:
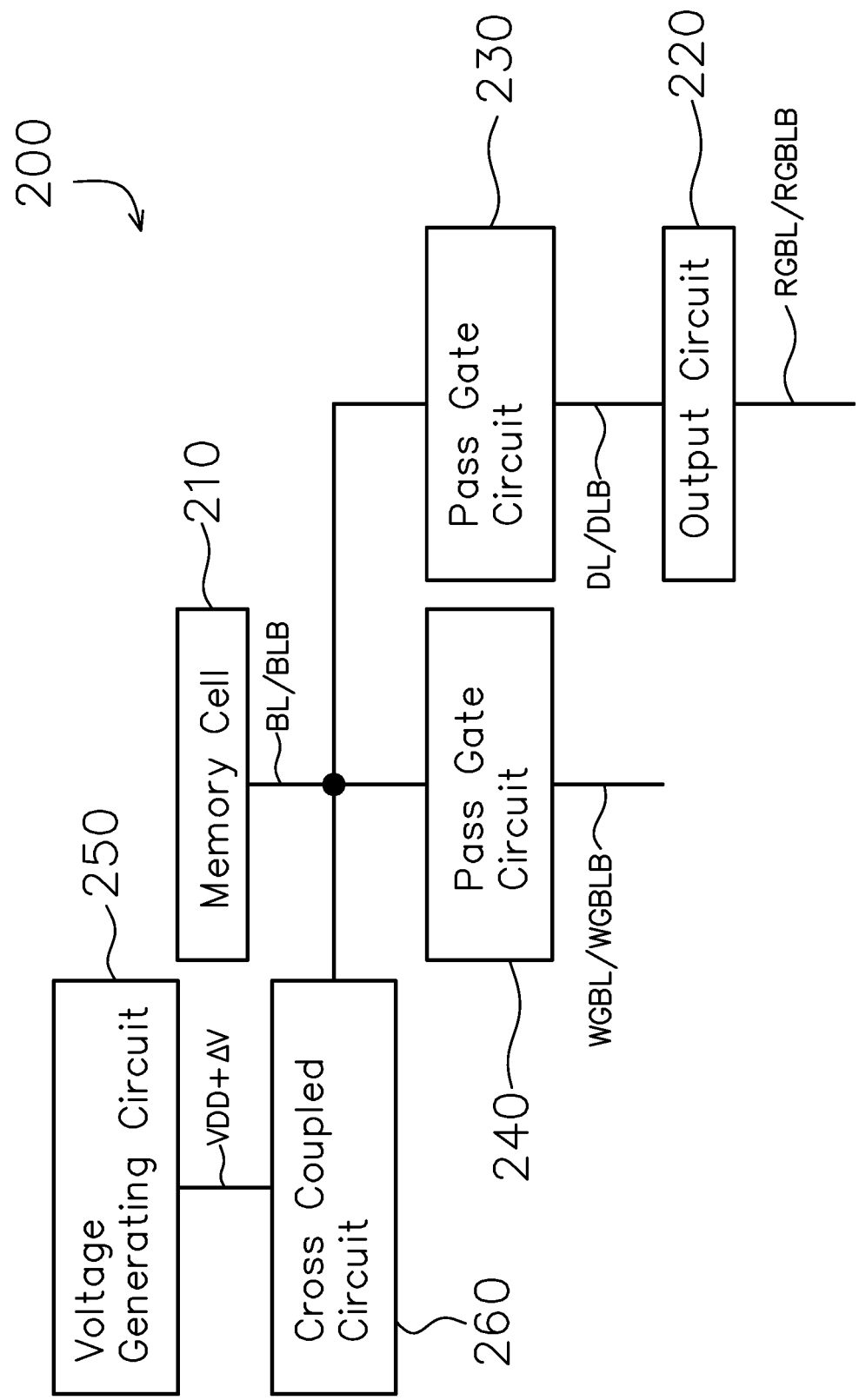
FIG. 2 is a schematic block diagram of an exemplary memory device according to some embodiments.

A schematic block diagram of an exemplary memory device 200, according to some embodiments, is illustrated in FIG. 2. The memory device 200 includes complementary local bit lines (BL, BLB), complementary data lines (DL, DLB), complementary global bit lines (RGBL, RGBLB), complementary global bit lines (WGBL, WGBLB), a memory cell 210, an output circuit 220, pass gate circuits 230, 240, a voltage generating circuit 250, and a cross coupled circuit 260. In this exemplary embodiment, the memory device 200 is implemented using metal-oxide semiconductor field-effect transistors (MOSFETs). It should be understood that a MOSFET includes first and second source/drain terminals and a gate terminal. In an alternative embodiment, the memory device 200 may be implemented with any type of transistor. In some embodiments, the memory device 200 is a static random access memory (SRAM) device. In other embodiments, the memory device 200 is a dynamic RAM (DRAM) device.

Figure 3:
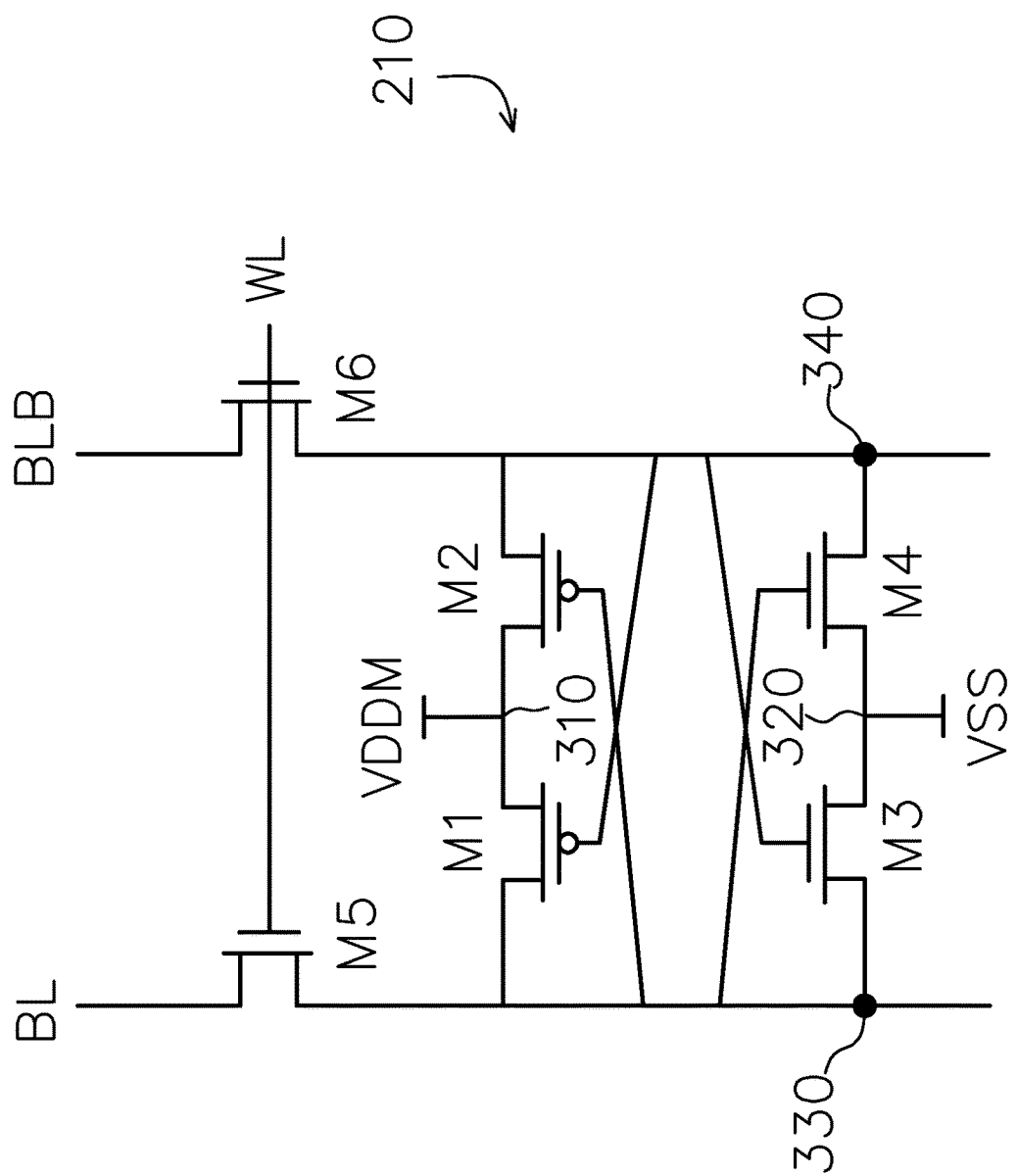
FIG. 3 is a schematic circuit diagram of an exemplary memory cell of the memory device according to some embodiments.

The memory cell 210 is connected to the local bit lines (BL, BLB) and is configured to store complementary bits of data therein. A schematic circuit diagram of the memory cell 210, according to some embodiments, is illustrated in FIG. 3. In this exemplary embodiment, the memory cell 210 is a six-transistor (6T) memory cell and includes a source voltage node 310, a reference voltage node 320, memory cell nodes 330, 340, p-channel MOSFETs (M1, M2), and n-channel MOSFETs (M3, M4, M5, M6). As illustrated in FIG. 3, a source voltage (VDDM), e.g., about 1.5V, and a reference voltage (VSS), e.g., about 0V, are respectively applied to the source and reference voltage nodes 310, 320. In some embodiments, the memory cell 210 may include any number of MOSFETs. In other embodiments, the memory cell 210 may have other configurations so long as such configurations are capable of storing complementary bits of data therein.

The MOSFETs (M1, M2, M3, M4) constitute a latch. The first source/drain terminals of the MOSFETs (M1, M2) are connected to each other and to the source voltage node 310. The first source/drain terminals of the MOSFETs (M3, M4) are connected to each other and to the reference voltage node 320. The second source/drain terminals of the MOSFETs (M1, M3) and the gate terminals of the MOSFETs (M2, M4) are connected to each other and to the memory cell node 330. The second source/drain terminals of the MOSFETs (M2, M4) and the gate terminals of the MOSFETs (M1, M3) are connected to each other and to the memory cell node 340.

The first source/drain terminals of the MOSFETs (M5, M6) are respectively connected to the memory cell nodes 330, 340. The second source/drain terminals of the MOSFETs (M5, M6) are respectively connected to the local bit lines (BL, BLB). The memory device 200 further includes a word line (WL). The gate terminals of the MOSFETs (M5, M6) are connected to each other and to the word line (WL).

Schematic circuit diagrams of the memory cell 210 during a read/write operation of the memory device 200, according to some embodiments, are illustrated in FIGS. 4A and 4B. As illustrated in FIG. 4A, during a read operation, in which bits '1' and '0' are respectively latched/stored in the memory cell nodes 330, 340, the MOSFETs (M1, M4) are turned on. The MOSFETs (M2, M3) are turned off and are therefore crossed out in FIG. 4A. At this time, when a voltage on the word line (WL) transitions from a low voltage level to a high voltage level, i.e., when the word line (WL) is activated, the MOSFETs (M5, M6) are turned on and connect electrically and respectively the memory cell nodes 330, 340 to the local bit lines (BL, BLB). As a result, the bits '1' and '0' are respectively transferred from the memory cell nodes 330, 340 to the local bit lines (BL, BLB), whereby complementary bits of data are read from the memory cell 210.

As illustrated in FIG. 4B, during another read operation, in which bits '0' and '1' are respectively stored in the memory cell nodes 330, 340, the MOSFETs (M2, M3) are turned on. The MOSFETs (M1, M4) are turned off and are therefore crossed out in FIG. 4B. At this time, when the word line (WL) is activated, the MOSFETs (M5, M6) are turned on and connect electrically and respectively the memory cell nodes 330, 340 to the local bit lines (BL, BLB). As a result, the bits '0' and '1' are respectively transferred from the memory cell nodes 330, 340 to the local bit lines (BL, BLB), whereby complementary bits of data are read from the memory cell 210.

Referring back to FIG. 4A, during a write operation, in which bits '1' and '0' are respectively on the local bit lines (BL, BLB), when the word line (WL) is activated, the MOSFETs (M5, M6) are turned on and connect electrically and respectively the memory cell nodes 330, 340 to the local bit lines (BL, BLB). As a result, the bits '1' and '0' are respectively transferred from the local bit lines (BL, BLB) to the memory cell nodes 330, 340. At this time, the MOSFETs (M1, M4) are turned on and the MOSFETs (M2, M3) are turned off, whereby complementary bits of data are written to the memory cell 210.

Referring now to FIG. 4B, during another write operation, in which bits '0' and '1' are respectively on the local bit lines (BL, BLB), when the word line (WL) is activated, the MOSFETs (M5, M6) are turned on and connect electrically and respectively the memory cell nodes 330, 340 to the local bit lines (BL, BLB). As a result, the bits '0' and '1' are respectively transferred from the local bit lines (BL, BLB) to the memory cell nodes 330, 340. At this time, the MOSFETs (M2, M3) are turned on and the MOSFETs (M1, M4) are turned off, whereby complementary bits of data are written to the memory cell 210.

It should be understood that the memory device 200 will sometimes include a plurality of banks, each of which includes a plurality of the memory cells 210 that are arranged in rows and columns.

Referring back to FIG. 2, the output circuit 220 is connected to the data lines (DL, DLB) and the global bit lines (RGBL, RGBLB) and is configured to output the low voltage level from the data line (DL/DLB) to the global bit line (RGBL/RGBLB).

Figure 5:
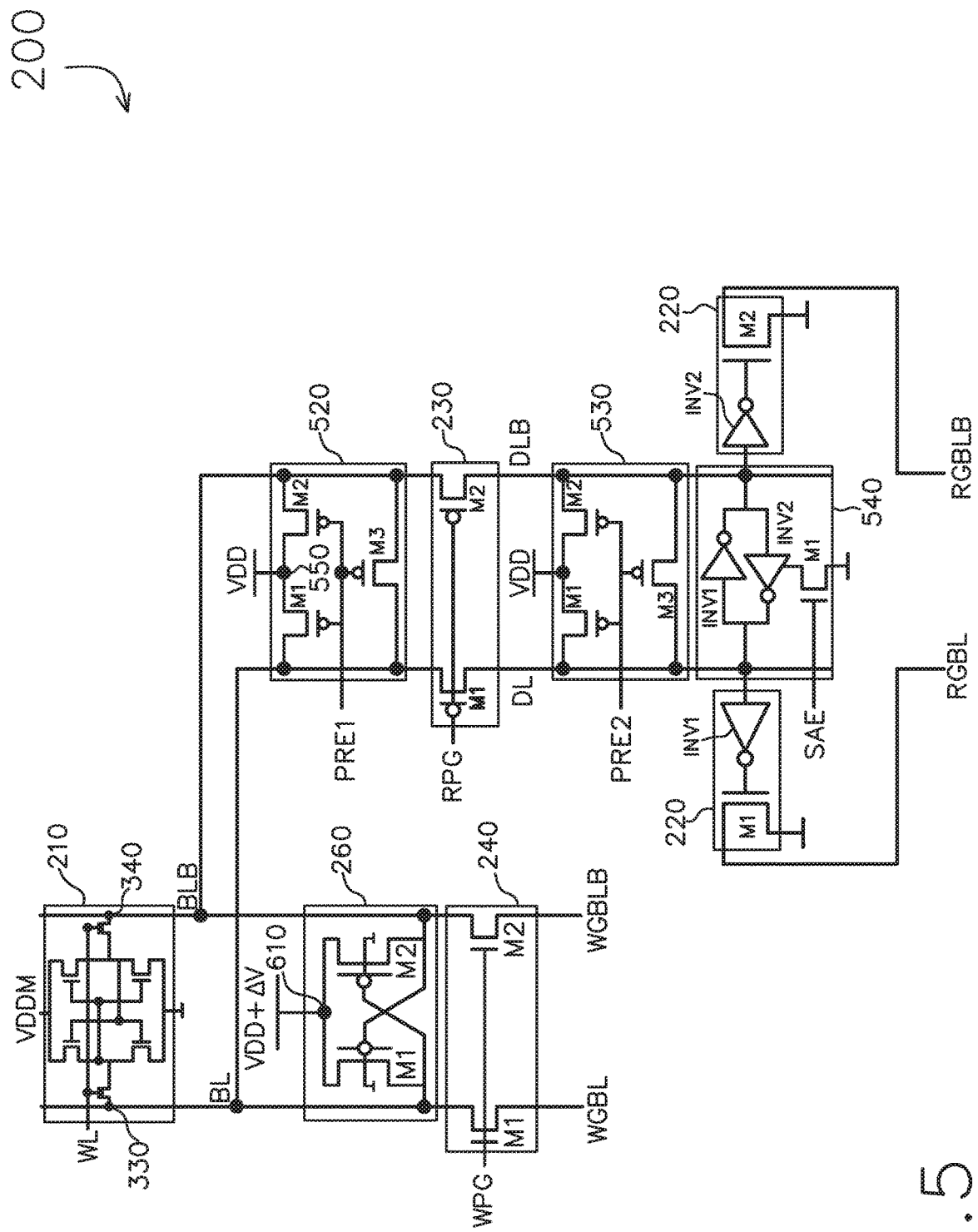
FIG. 5 is a schematic circuit diagram of the memory device according to some embodiments.

A schematic circuit diagram of the memory device 200, according to some embodiments, is illustrated in FIG. 5. The output circuit 220 includes n-channel MOSFETs (M1, M2) and inverters (INV1, INV2) respectively between the data line (DL) and the gate terminal of the MOSFET (M1) thereof and between the data line (DLB) and the gate terminal of the MOSFET (M2) thereof. The first source/drain terminals of the MOSFETs (M1, M2) of the output circuit 220 are respectively connected to the global bit lines (RGBL, RGBLB). The second source/drain terminals of the MOSFETs (M1, M2) of the output circuit 220 are connected to each other and to the reference voltage node 320.

The memory device 200 further includes pre-charging circuits 520, 530 and a sensing circuit 540. Each of the pre-charging circuits 520, 530 includes a pre-charger and an equalizer. The pre-charger of the pre-charging circuit 520 includes an enable node (PRE1), a source voltage node 550, and p-channel MOSFETs (M1, M2) and is configured to pre-charge the local bit lines (BL, BLB) to a level of a source voltage (VDD), e.g., about 1.0V, applied to the source voltage node 550. The first source/drain terminals of the MOSFETs (M1, M2) of the pre-charger of the pre-charging circuit 520 are connected to each other and to the source voltage node 550. The second source/drain terminals of the MOSFETs (M1, M2) of the pre-charger of the pre-charging circuit 520 are respectively connected to the local bit lines (BL, BLB). The gate terminals of the MOSFETs (M1, M2) of the pre-charger of the pre-charging circuit 520 are connected to each other and to the enable node (PRE1). The equalizer of the pre-charging circuit 520 is configured to equalize levels of voltages on the local bit lines (BL, BLB) and includes a p-channel MOSFET (M3). The first and second source/drain terminals of the MOSFET (M3) of the equalizer of the pre-charging circuit 520 are respectively connected to the local bit lines (BL, BLB). In this exemplary embodiment, the gate terminal of the MOSFET (M3) of the equalizer of the pre-charging circuit 520 is connected to the enable node (PRE1).

In an alternative embodiment, the gate terminal of the MOSFET (M3) of the equalizer of the pre-charging circuit 520 is connected to another enable node (not shown). In such an alternative embodiment, the equalizer of the pre-charging circuit 520 is controlled independently of the pre-charger of the pre-charging circuit 520.

The pre-charger of the pre-charging circuit 530 includes an enable node (PRE2) and p-channel MOSFETs (M1, M2) and is configured to pre-charge the data lines (DL, DLB) to the level of the source voltage (VDD). The first source/drain terminals of the MOSFETs (M1, M2) of the pre-charger of the pre-charging circuit 530 are connected to each other and to the source voltage node 550. The second source/drain terminals of the MOSFETs (M1, M2) of the pre-charger of the pre-charging circuit 530 are respectively connected to the data lines (DL, DLB). The gate terminals of the MOSFETs (M1, M2) of the pre-charger of the pre-charging circuit 530 are connected to each other and to the enable node (PRE2). The equalizer of the pre-charging circuit 530 is configured to equalize levels of voltages on the data lines (DL, DLB) and includes a p-channel MOSFET (M3). The first and second source/drain terminals of the MOSFET (M3) of the equalizer of the pre-charging circuit 530 are respectively connected to the data lines (DL, DLB). In this exemplary embodiment, the gate terminal of the MOSFET (M3) of the equalizer of the pre-charging circuit 530 is connected to the enable node (PRE2).

In an alternative embodiment, the gate terminal of the MOSFET (M3) of the equalizer of the pre-charging circuit 530 is connected to another enable node (not shown). In such an alternative embodiment, the equalizer of the pre-charging circuit 530 is controlled independently of the pre-charger of the pre-charging circuit 530.

The sensing circuit 540 is connected to the data lines (DL, DLB) and is configured to sense a difference between levels of voltages on the data lines (DL, DLB) and to amplify the difference sensed thereby. The sensing circuit 540, in this exemplary embodiment, is a differential sense amplifier and includes an enable node (SAE), inverters (INV1, INV2), and an n-channel MOSFET (M1). Each of the inverters (INV1, INV2) of the sensing circuit 540 has input and output terminals. The input terminal of the first inverter (INV1) and the output terminal of the inverter (INV2) of the sensing circuit 540 are connected to each other and to the data line (DL). The output terminal of the first inverter (INV1) and the input terminal of the inverter (INV2) of the sensing circuit 540 are connected to each other and to the data line (DLB). The first and second source/drain terminals and the gate terminal of the MOSFET (M1) of the sensing circuit 540 are respectively connected to the inverter (INV2), the reference voltage node 320, and the enable node (SAE).

Referring back to FIG. 2, the pass gate circuit 230 is connected to the local bit lines (BL, BLB) and the data lines (DL, DLB) and is configured to electrically and respectively connect the local bit lines (BL, BLB) to the data lines (DL, DLB). As illustrated in FIG. 5, the pass gate circuit 230 includes an enable node (RPG) and p-channel MOSFETs (M1, M2). The first source/drain terminals of the MOSFETs (M1, M2) of the pass gate circuit 230 are respectively connected to the local bit lines (BL, BLB). The second source/drain terminals of the MOSFETs (M1, M2) of the pass gate circuit 230 are respectively connected to the data lines (DL, DLB). The gate terminals of the MOSFETs (M1, M2) of the pass gate circuit 230 are connected to each other and to the enable node (RPG).

Referring back to FIG. 2, the pass gate circuit 240 is connected to the local bit lines (BL, BLB) and the global bit lines (WGBL, WGBLB) and is configured to electrically and respectively connect the local bit lines (BL, BLB) to the global bit lines (WGBL, WGBLB). As illustrated in FIG. 5, the pass gate circuit 240 includes an enable node (WPG) and n-channel MOSFETs (M1, M2). The first source/drain terminals of the MOSFETs (M1, M2) of the pass gate circuit 240 are respectively connected to the local bit lines (BL, BLB). The second source/drain terminals of the MOSFETs (M1, M2) of the pass gate circuit 240 are respectively connected to the global bit lines (WGBL, WGBLB). The gate terminals of the MOSFETs (M1, M2) of the pass gate circuit 240 are connected to each other and to the enable node (WPG).

Referring back to FIG. 2, the voltage generating circuit 250 is configured to provide a high speed voltage (VDD+ΔV), e.g., about 1.2V, greater than the source voltage (VDD). In some embodiments, the high speed voltage (VDD+ΔV) is less than the source voltage (VDDM). In other embodiments, the high speed voltage (VDD+ΔV) is substantially equal to the source voltage (VDDM).

Figure 6B:
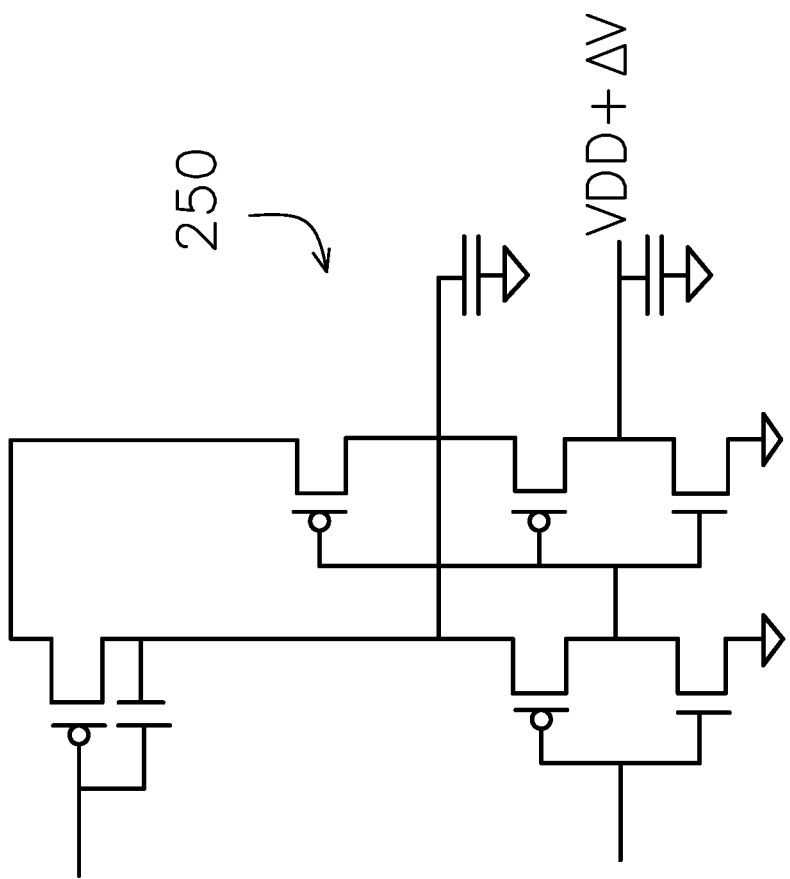
FIGS. 6A-6C are schematic circuit diagrams of exemplary voltage generating circuits of the memory device according to some embodiments.
Figure 6A:
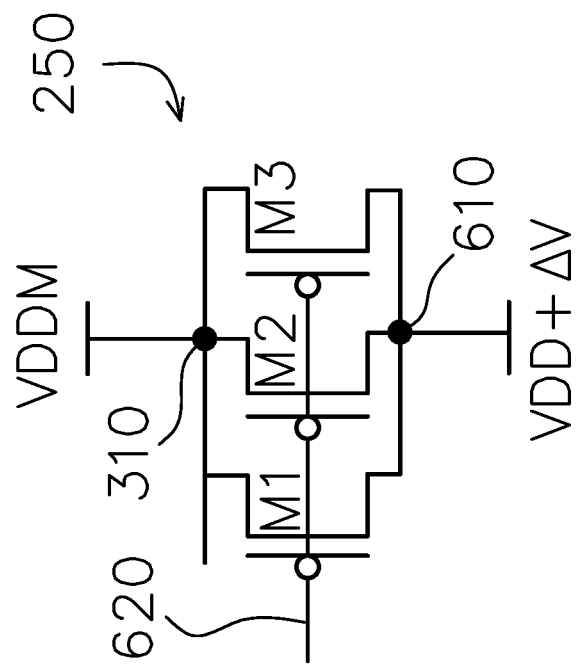
Figure 6C:
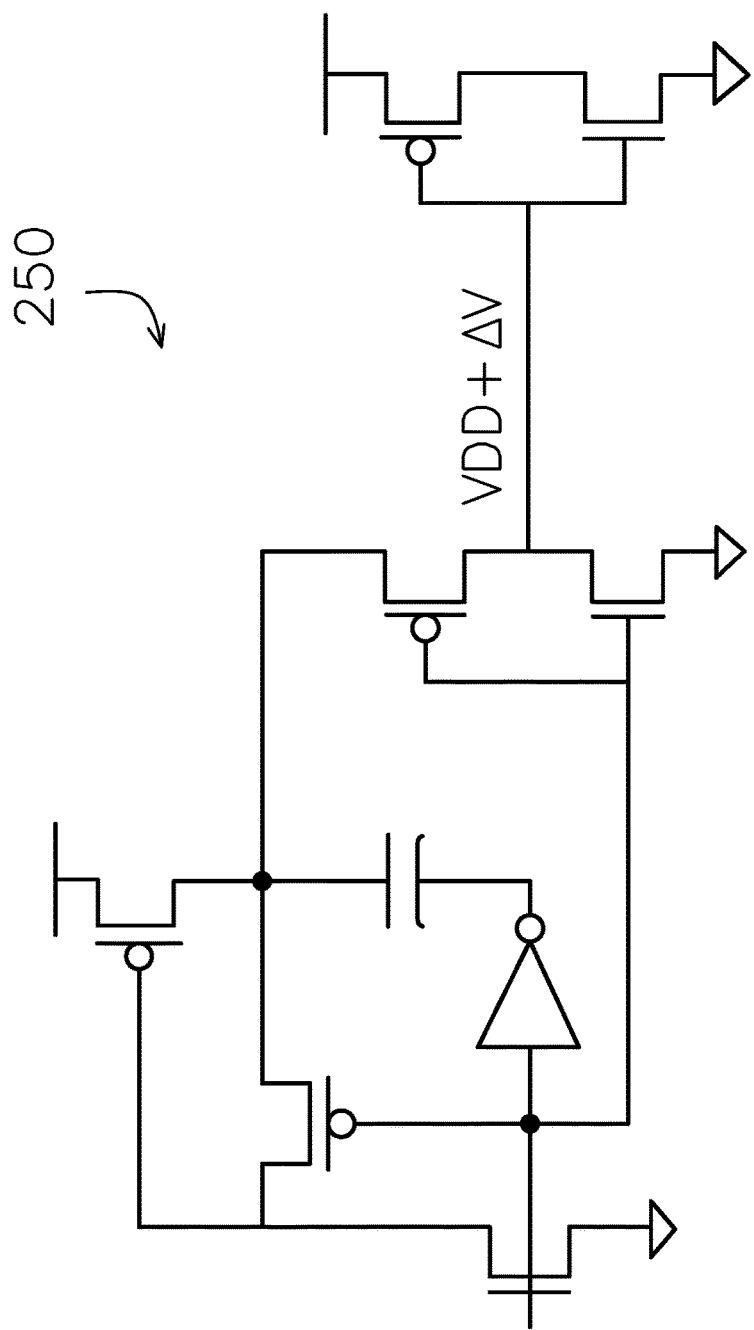

Schematic circuit diagrams of exemplary voltage generating circuits 250 of the memory device 200, according to some embodiments, are illustrated in FIGS. 6A-6C. As illustrated in FIG. 6A, the voltage generating circuit 250 includes a high speed voltage node 610, an enable node 620, and p-channel MOSFETs (M1, M2, M3). The first source/drain terminals of the MOSFETs (M1, M2, M3) are connected to each other and to the source voltage node 310. The second source/drain terminals of the MOSFETs (M1, M2, M3) are connected to each other and to the high speed voltage node 610. The gate terminals of the MOSFETs (M1, M2, M3) are connected to each other and to the enable node 620. In operation, when a voltage at the enable node 620 transitions from the high voltage level to the low voltage level, the MOSFETs (M1, M2, M3) are turned on and the high speed voltage (VDD+ΔV) is applied to the high speed voltage node 610.

Although the voltage generating circuit 250 is exemplified in FIG. 6A as having three MOSFETs (M1, M2, M3), it will be appreciated that, after reading this disclosure, the number of the MOSFETs thereof may be increased/decreased as required. In an alternative embodiment, the voltage generating circuit 250 may have other configurations such as those illustrated in FIGS. 6B and 6C.

Referring back to FIG. 2, the cross coupled circuit 260 is connected to the local bit lines (BL, BLB) and the voltage generating circuit 250 and is configured to pull the local bit line (BL/BLB) to a level of the high speed voltage (VDD+ΔV).

As illustrated in FIG. 5, the cross coupled circuit 260 includes a cross-coupled MOSFET pair that has a pair of p-channel MOSFETs (M1, M2). In this exemplary embodiment, each of the MOSFETs (M1, M2) of the cross-coupled MOSFET pair of the cross coupled circuit 260, aside from the first and second source/drain terminals and the gate terminal, further includes a bulk and the gate terminal thereof is connected to the bulk thereof and has a threshold voltage that varies with a bias voltage applied thereto. The first source/drain terminals of the MOSFETs (M1, M2) of the cross-coupled MOSFET pair of the cross coupled circuit 260 are connected to each other and to the high speed voltage node 610. The second source/drain terminal of the MOSFET (M1) and the gate terminal of the MOSFET (M2) of the cross-coupled MOSFET pair of the cross coupled circuit 260 are connected to each other and to the local bit line (BL). The second source/drain terminal of the MOSFET (M2) and the gate terminal of the MOSFET (M1) of the cross-coupled MOSFET pair of the cross coupled circuit 260 are connected to each other and to the local bit line (BLB).

Figure 7A:
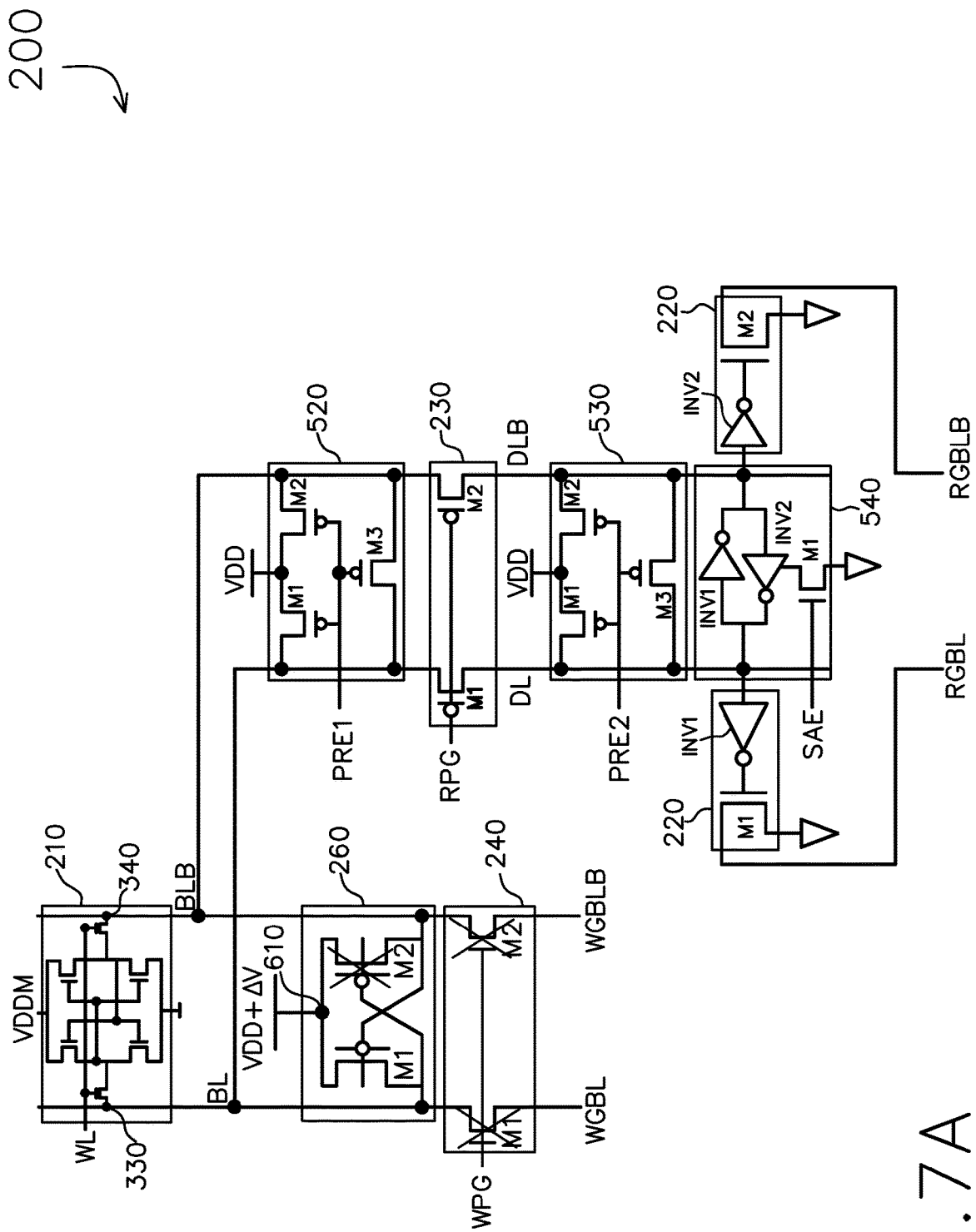
FIGS. 7A and 7B are schematic circuit diagrams of the memory device during a read operation thereof according to some embodiments.
Figure 7B:
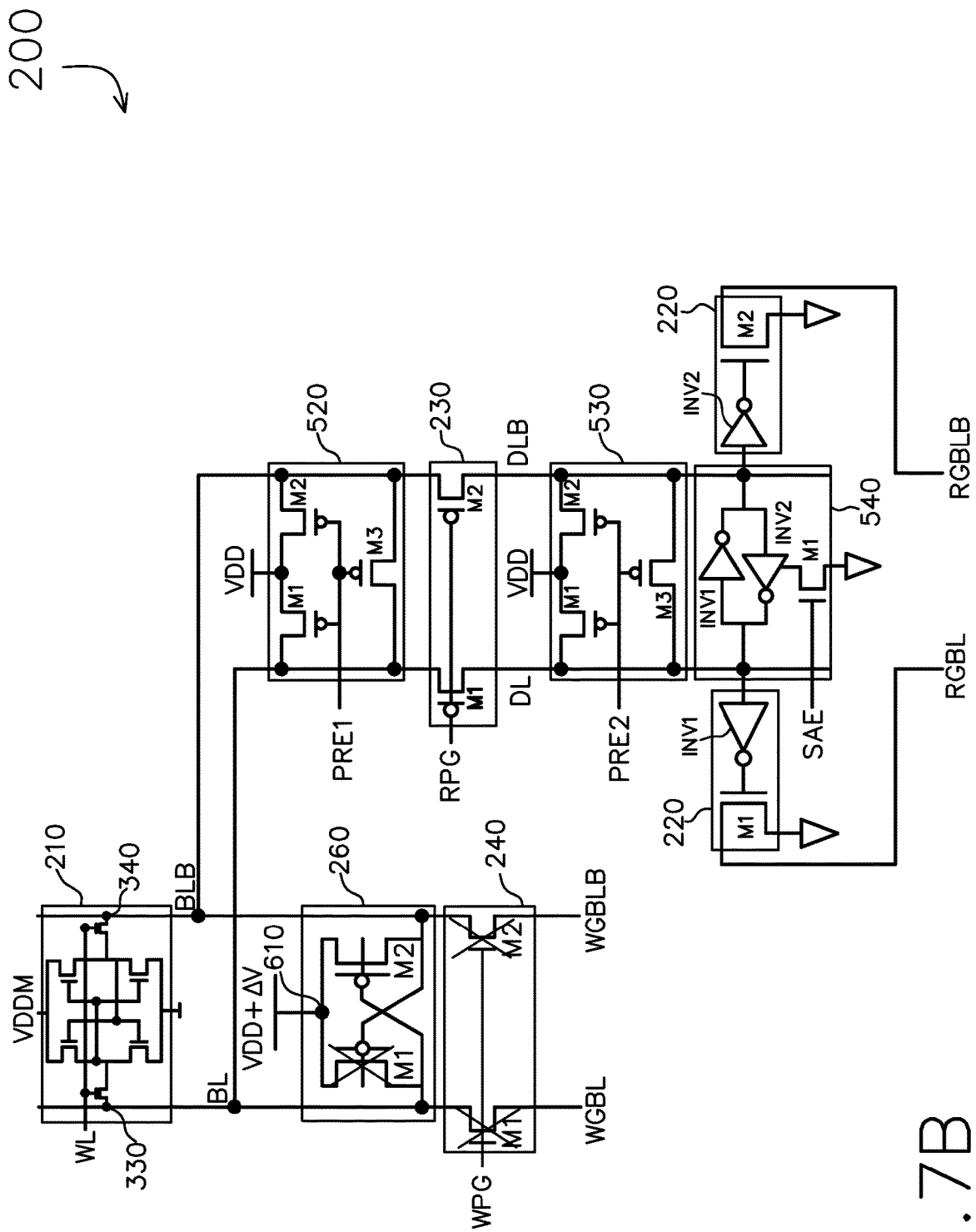

Schematic circuit diagrams of the memory device 200 during a read operation thereof, according to some embodiments, are illustrated in FIGS. 7A and 7B. Prior to a read operation, voltages at the enable nodes (PRE1, PRE2) are at the low voltage level and the MOSFETs (M1, M2, M3) of the pre-charging circuits 520, 530 are turned on. As a result, the local bit lines (BL, BLB) and the data lines (DL, DLB) are pre-charged to the high voltage level and levels of voltages thereon are equalized, at substantially the same time. Subsequently, when the voltages at the enable nodes (PRE1, PRE2) transition from the low voltage level to the high voltage level, the MOSFETs (M1, M2, M3) of the pre-charging circuits 520, 530 are turned off. As a result, the local bit lines (BL, BLB) and the data lines (DL, DLB) are left floating at the high voltage level.

In an alternative embodiment, prior to a read operation of the memory device 200, levels of voltages on the local bit lines (BL, BLB) and/or levels of voltages on the data lines (DL, DLB) are equalized first and then the local bit lines (BL, BLB) and/or the data lines (DL, DLB) are pre-charged to the high voltage level, thereby minimizing power consumption of the memory device 200.

As illustrated in FIG. 7A, during a read operation, in which bits '1' and '0' are respectively latched/stored in the memory cell nodes 330, 340 of the memory cell 210, when a voltage at the enable node (RPG) transitions from the high voltage level to the low voltage level, the MOSFETs (M1, M2) of the pass gate circuit 230 are turned on and connect electrically and respectively the local bit lines (BL, BLB) to the data lines (DL, DLB). At this time, the word line (WL) is activated. As a result, the bits '1' and '0' are respectively transferred from the local bit lines (BL, BLB) to the data lines (DL, DLB). This pulls the data line (DLB) towards the low voltage level, lowers a level of a bias voltage applied to the MOSFET (M1) of the cross-coupled MOSFET pair of the cross coupled circuit 260 towards the low voltage level, decreases a threshold voltage of the MOSFET (M1) of the cross-coupled MOSFET pair of the cross coupled circuit 260, and eventually turns on the MOSFET (M1) of the cross-coupled MOSFET pair of the cross coupled circuit 260. As this occurs, the cross coupled circuit 260 pulls the data line (DL), via the local bit line (BL), towards the level of the high speed voltage (VDD+ΔV). This raises a level of a bias voltage applied to the MOSFET (M2) of the cross-coupled MOSFET pair of the cross coupled circuit 260 towards the level of the high speed voltage (VDD+ΔV). This, in turn, increases a threshold voltage of the MOSFET (M2) of the cross-coupled MOSFET pair of the cross coupled circuit 260. The MOSFET (M2) of the cross-coupled MOSFET pair of the cross coupled circuit 260 is eventually turned off and is therefore crossed out in FIG. 7A. The pass gate circuit 240 is not in operation and the MOSFETs (M1, M2) thereof are also crossed out in FIG. 7A.

When the sensing circuit 540 senses that a difference between levels of voltages on the data lines (DL, DLB) exceeds a threshold level, a voltage at the enable node (SAE) transitions from the low voltage level to the high voltage level. This pulls the data line (DLB) to the low voltage level. Thereafter, the low level voltage is transferred by the output circuit 220 from the data line (DLB) to the global bit line (RGBLB), whereby complementary bits of data are read from the memory cell 210.

As illustrated in FIG. 7B, during another read operation, in which bits '0' and '1' are respectively stored in the memory cell nodes 330, 340 of the memory cell 210, when a voltage at the enable node (RPG) transitions from the high voltage level to the low voltage level, the MOSFETs (M1, M2) of the pass gate circuit 230 are turned on and connect electrically and respectively the local bit lines (BL, BLB) to the data lines (DL, DLB). At this time, the word line (WL) is activated. As a result, the bits '0' and '1' are respectively transferred from the local bit lines (BL, BLB) to the data lines (DL, DLB). This pulls the data line (DL) towards the low voltage level, lowers a level of a bias voltage applied to the MOSFET (M2) of the cross-coupled MOSFET pair of the cross coupled circuit 260 towards the low voltage level, decreases a threshold voltage of the MOSFET (M2) of the cross-coupled MOSFET pair of the cross coupled circuit 260, and eventually turns on the MOSFET (M2) of the cross-coupled MOSFET pair of the cross coupled circuit 260. As this occurs, the cross coupled circuit 260 pulls the data line (DLB), via the local bit line (BLB), towards the level of the high speed voltage (VDD+ΔV). This raises a level of a bias voltage applied to the MOSFET (M1) of the cross-coupled MOSFET pair of the cross coupled circuit 260 towards the level of the high speed voltage (VDD+ΔV). This, in turn, increases a threshold voltage of the MOSFET (M1) of the cross-coupled MOSFET pair of the cross coupled circuit 260. The MOSFET (M1) of the cross-coupled MOSFET pair of the cross coupled circuit 260 is eventually turned off and is therefore crossed out in FIG. 7B. The pass gate circuit 240 is not in operation and the MOSFETs (M1, M2) thereof are also crossed out in FIG. 7B.

When the sensing circuit 540 senses that a difference between levels of voltages on the data lines (DL, DLB) exceeds a threshold level, a voltage at the enable node (SAE) transitions from the low voltage level to the high voltage level. This pulls the data line (DL) to the low voltage level. Thereafter, the low level voltage is transferred by the output circuit 220 from the data line (DL) to the global bit line (RGBL), whereby complementary bits of data are read from the memory cell 210.

In an alternative embodiment, instead of to the local bit lines (BL, BLB), the cross coupled circuit 260 of the memory device 200 is connected to the data lines (DL, DLB)

and is therefore configured to pull the data line (DL/DLB) to the level of the high speed voltage (VDD+ΔV).

Figure 8A:
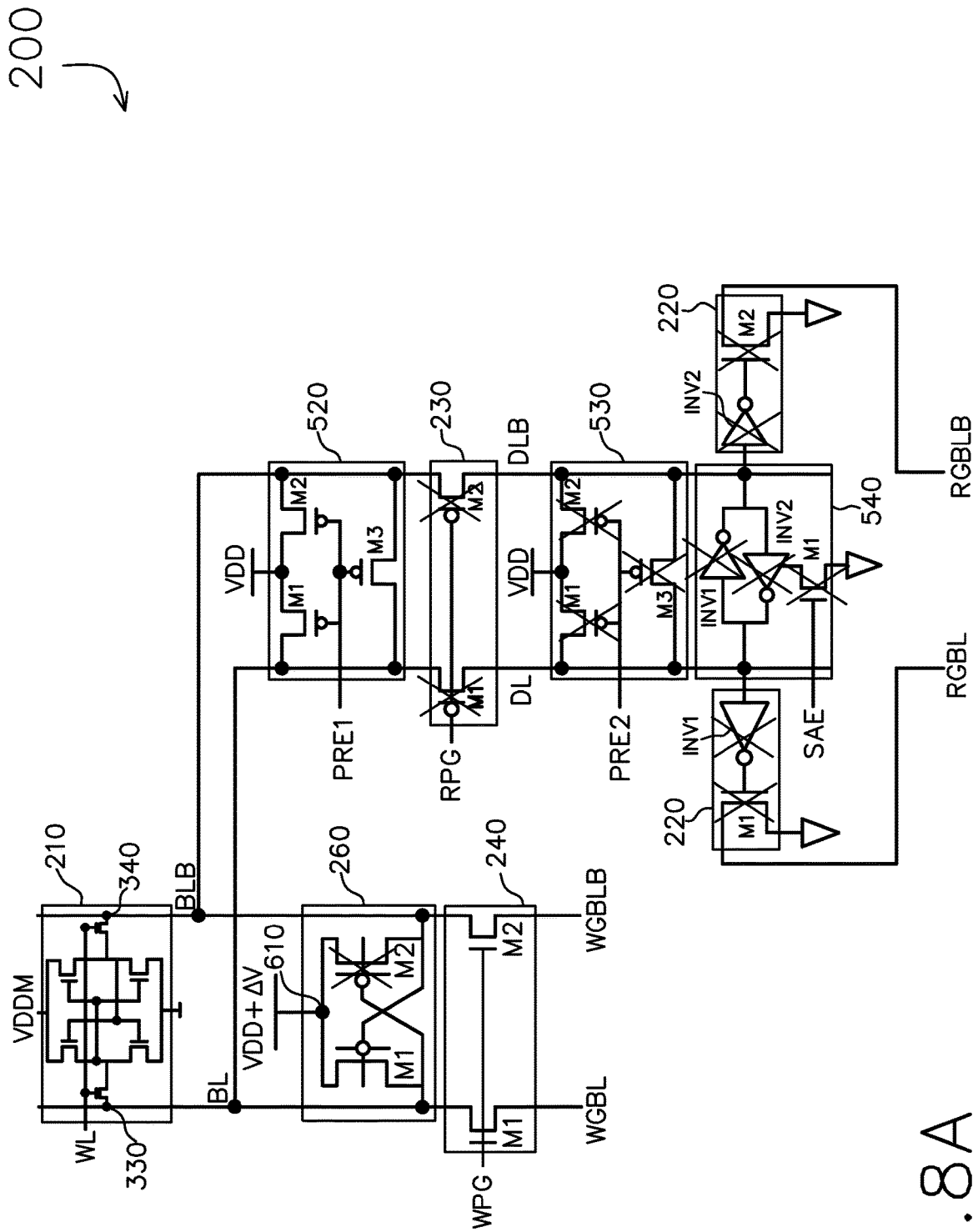
FIGS. 8A and 8B are schematic circuit diagrams of the memory device during a write operation thereof according to some embodiments.
Figure 8B:
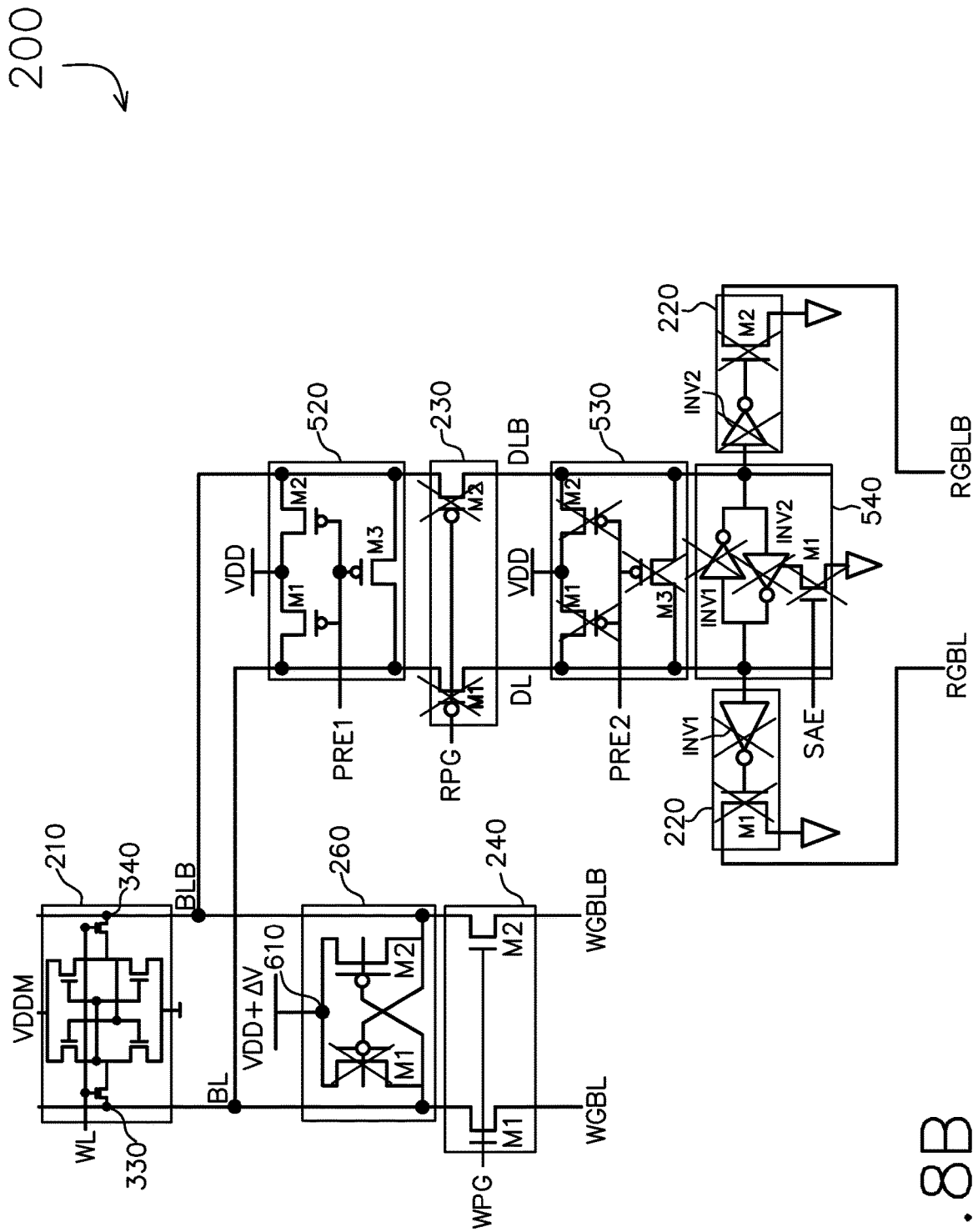

Schematic circuit diagrams of the memory device 200 during a write operation thereof, according to some embodiments, are illustrated in FIGS. 8A and 8B. Prior to a write operation, a voltage at the enable node (PRE1) is at the low voltage level and the MOSFETs (M1, M2, M3) of the pre-charging circuit 520 are turned on. As a result, the local bit lines (BL, BLB) are pre-charged to the high voltage level and levels of voltages thereon are equalized, at substantially the same time. Subsequently, when the voltage at the enable node (PRE1) transitions from the low voltage level to the high voltage level, the MOSFETs (M1, M2, M3) of the pre-charging circuit 520 are turned off. As a result, the local bit lines (BL, BLB) are left floating at the high voltage level.

In an alternative embodiment, prior to a write operation of the memory device 200, levels of voltages on the local bit lines (BL, BLB) are equalized first and then the local bit lines (BL, BLB) are pre-charged to the high voltage level, thereby minimizing power consumption of the memory device 200.

As illustrated in FIG. 8A, during a write operation, in which bits '1' and '0' are respectively on the global bit lines (WGBL, WGBLB), when a voltage at the enable node (WPG) transitions from the low voltage level to the high voltage level, the MOSFETs (M1, M2) of the pass gate circuit 240 are turned on and connect respectively and electrically the local bit lines (BL, BLB) to the global bit lines (WGBL, WGBLB). As a result, the bits '1' and '0' are respectively transferred from the global bit lines (WGBL, WGBLB) to the local bit lines (BL, BLB). This pulls the local bit line (BLB) towards the low voltage level. As this occurs, the cross coupled circuit 260 pulls the local bit line (BL) towards the level of the high speed voltage (VDD+ΔV), thereby enhancing writing of the memory device 200. The MOSFET (M2) of the cross-coupled MOSFET pair of the cross coupled circuit 260 is turned off and is therefore crossed out in FIG. 8A. The output circuit 220, the pass gate circuit 230, the pre-charging circuit 530, and the sensing circuit 540 are not in operation and the MOSFETs/inverters thereof are also crossed out in FIG. 8A. At this time, when the word line (WL) is activated, complementary bits of data are written to the memory cell 210.

As illustrated in FIG. 8B, during another write operation, in which bits '0' and '1' are respectively on the global bit lines (WGBL, WGBLB), when a voltage at the enable node (WPG) transitions from the low voltage level to the high voltage level, the MOSFETs (M1, M2) of the pass gate circuit 240 are turned on and connect respectively and electrically the local bit lines (BL, BLB) to the global bit lines (WGBL, WGBLB). As a result, the bits '0' and '1' are respectively transferred from the global bit lines (WGBL, WGBLB) to the local bit lines (BL, BLB). This pulls the local bit line (BL) towards the low voltage level. As this occurs, the cross coupled circuit 260 pulls the local bit line (BLB) towards the level of the high speed voltage (VDD+ΔV), thereby enhancing writing of the memory device 200. The MOSFET (M1) of the cross-coupled MOSFET pair of the cross coupled circuit 260 is turned off and is therefore crossed out in FIG. 8B. The output circuit 220, the pass gate circuit 230, the pre-charging circuit 530, and the sensing circuit 540 are not in operation and the MOSFETs/inverters thereof are also crossed out in FIG. 8B. At this time, when the word line (WL) is activated, complementary bits of data are written to the memory cell 210.

Figure 9:
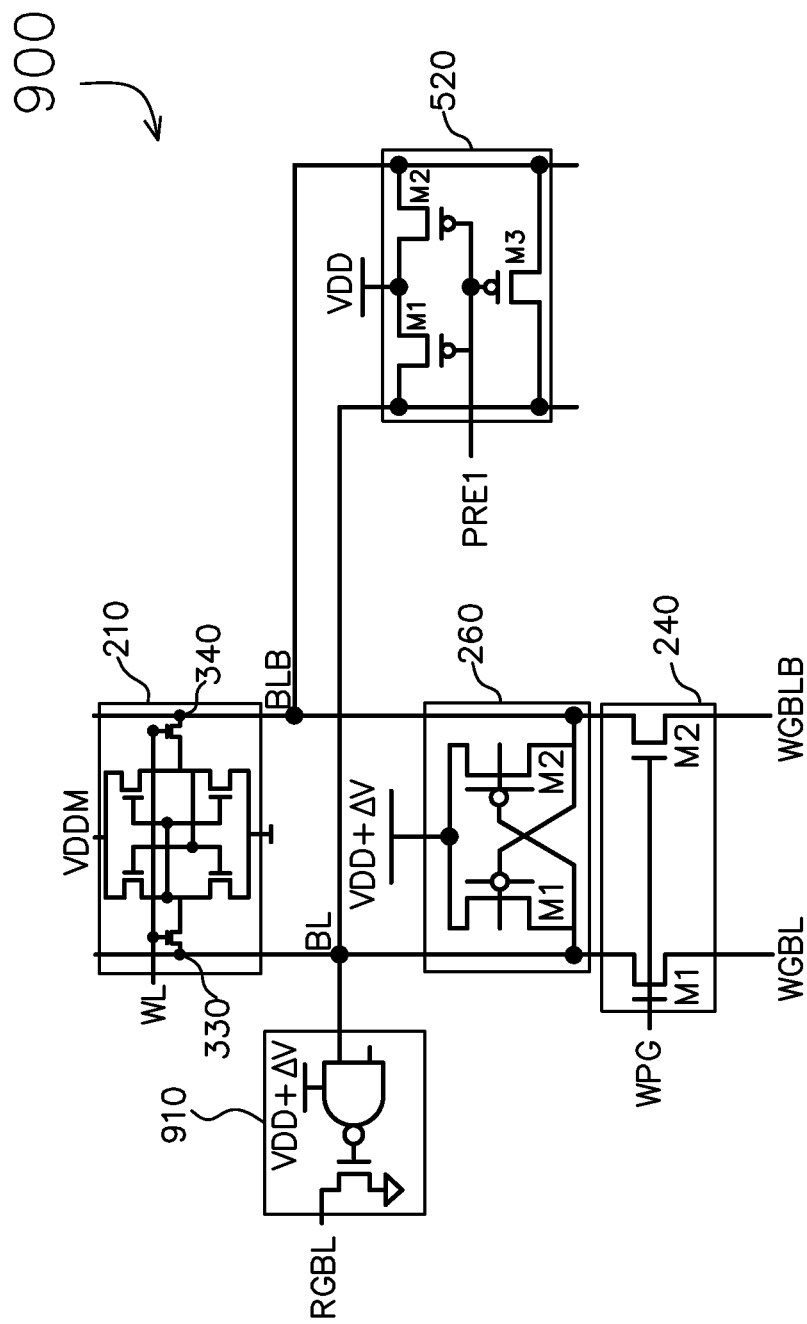
FIG. 9 is a schematic circuit diagram of another exemplary memory device according to some embodiments.

A schematic circuit diagram of another exemplary memory device 900, according to some embodiments, is illustrated in FIG. 9. It will be appreciated that, after reading this disclosure, other configurations for the sensing circuit 540 are possible so long as they achieve the intended purpose described herein. For example, as illustrated in FIG. 9, when compared with the memory device 200, the sensing circuit 910 of the memory device 900 is a single-ended sense amplifier and is connected to the local bit line (BL). The memory device 900 is dispensed with the output circuit 220, the pass gate circuit 230, and the pre-charging circuit 530. In this exemplary embodiment, the sensing circuit 910 includes an n-channel MOSFET connected to the global bit line (RGBL) and the reference voltage node 320 and a NAND gate connected between the local bit line (BL) and the n-channel MOSFET thereof and to the high speed voltage node 610. In an alternative embodiment, the sensing circuit 910 is connected to the local bit line (BLB).

Figure 10:
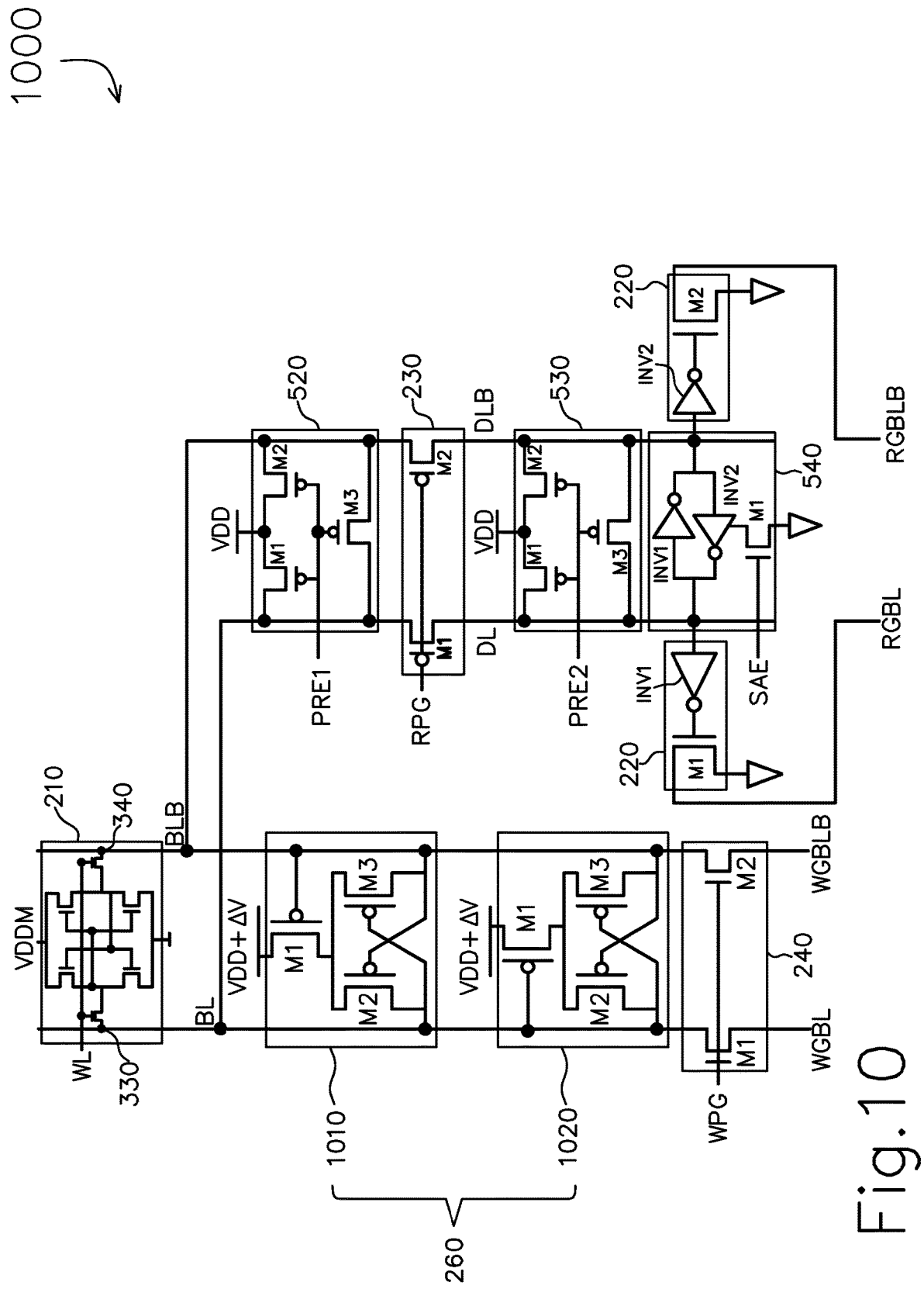
FIG. 10 is a schematic circuit diagram of another exemplary memory device according to some embodiments.

A schematic circuit diagram of another exemplary memory device 1000, according to some embodiments, is illustrated in FIG. 10. When compared with the memory device 200, the cross coupled circuit 260 of the memory device 1000 includes cross-coupled MOSFET pairs 1010, 1020, each of which includes a switch (M1) and p-channel MOSFETs (M2, M3). The switches (M1) each include a p-channel MOSFET. The first source/drain terminals of the MOSFETs (M1, M2, M3) of the cross-coupled MOSFET pair 1010 are connected to each other. The second source/drain terminal and the gate terminal of the MOSFET (M1) of the cross-coupled MOSFET pair 1010 are respectively connected to the high speed voltage node 610 and the local bit line (BLB). The second source/drain terminal of the MOSFET (M2) and the gate terminal of the MOSFET (M3) of the cross-coupled MOSFET pair 1010 are connected to each other and to the local bit line (BL). The second source/drain terminal of the MOSFET (M3) and the gate terminal of the MOSFET (M2) of the cross-coupled MOSFET pair 1010 are connected to each other and to the local bit line (BLB). In this exemplary embodiment, the MOSFET (M2) of the cross-coupled MOSFET pair 1010 has a switching speed faster than a switching speed of the MOSFET (M3) of the cross-coupled MOSFET pair 1010. As an example, the MOSFET (M2) of the cross-coupled MOSFET pair 1010 has a W/L ratio greater than a W/L ratio of the MOSFET (M3) of the cross-coupled MOSFET pair 1010. As another example, the MOSFET (M2) of the cross-coupled MOSFET pair 1010, which is, e.g., an ultra-low threshold voltage (ULVT) MOSFET, has a threshold voltage less than a threshold voltage of the MOSFET (M3) of the cross-coupled MOSFET pair 1010, which is, e.g., a standard threshold voltage (HVT) MOSFET.

The first source/drain terminals of the MOSFETs (M1, M2, M3) of the cross-coupled MOSFET pair 1020 are connected to each other. The second source/drain terminal and the gate terminal of the MOSFET (M1) of the cross-coupled MOSFET pair 1020 are respectively connected to the high speed voltage node 610 and the local bit line (BL). The second source/drain terminal of the MOSFET (M2) and the gate terminal of the MOSFET (M3) of the cross-coupled MOSFET pair 1020 are connected to each other and to the local bit line (BL). The second source/drain terminal of the MOSFET (M3) and the gate terminal of the MOSFET (M2) of the cross-coupled MOSFET pair 1020 are connected to each other and to the local bit line (BLB). In this exemplary embodiment, the MOSFET (M3) of the cross-coupled MOSFET pair 1020 has a switching speed faster than a switching speed of the MOSFET (M2) of the cross-coupled MOSFET pair 1020. As an example, the MOSFET (M3) of the cross-coupled MOSFET pair 1020 has a W/L ratio greater than a W/L ratio of the MOSFET (M2) of the cross-coupled MOSFET pair 1020. As another example, the MOSFET (M3) of the cross-coupled MOSFET pair 1020, which is, e.g., a ULVT MOSFET, has a threshold voltage less than a threshold voltage of the MOSFET (M2) of the cross-coupled MOSFET pair 1020, which is, e.g., a SVT MOSFET.

Figure 11A:
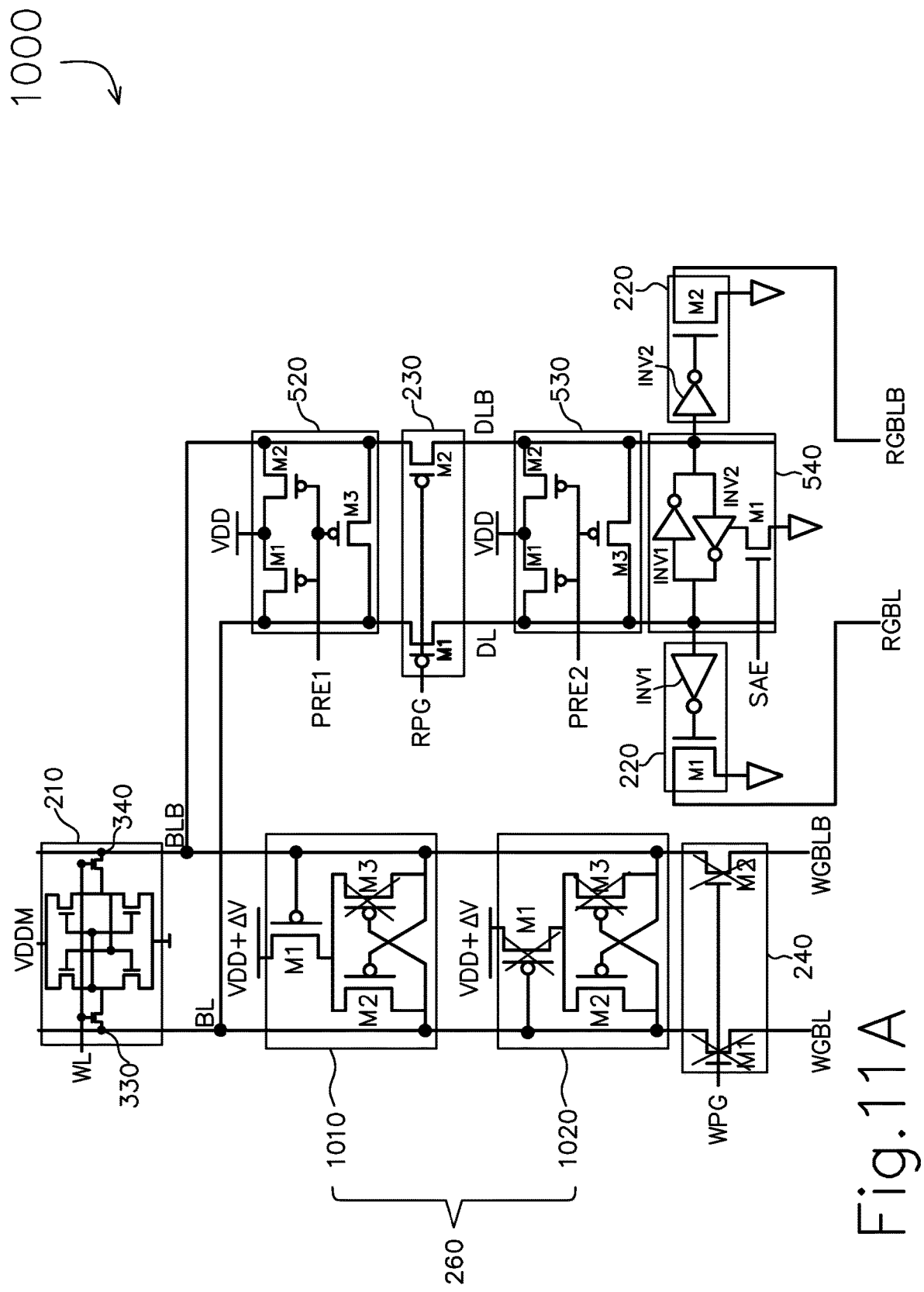
FIGS. 11A and 11B are schematic circuit diagrams of the memory device of FIG. 10 during a read operation thereof according to some embodiments.
Figure 11B:
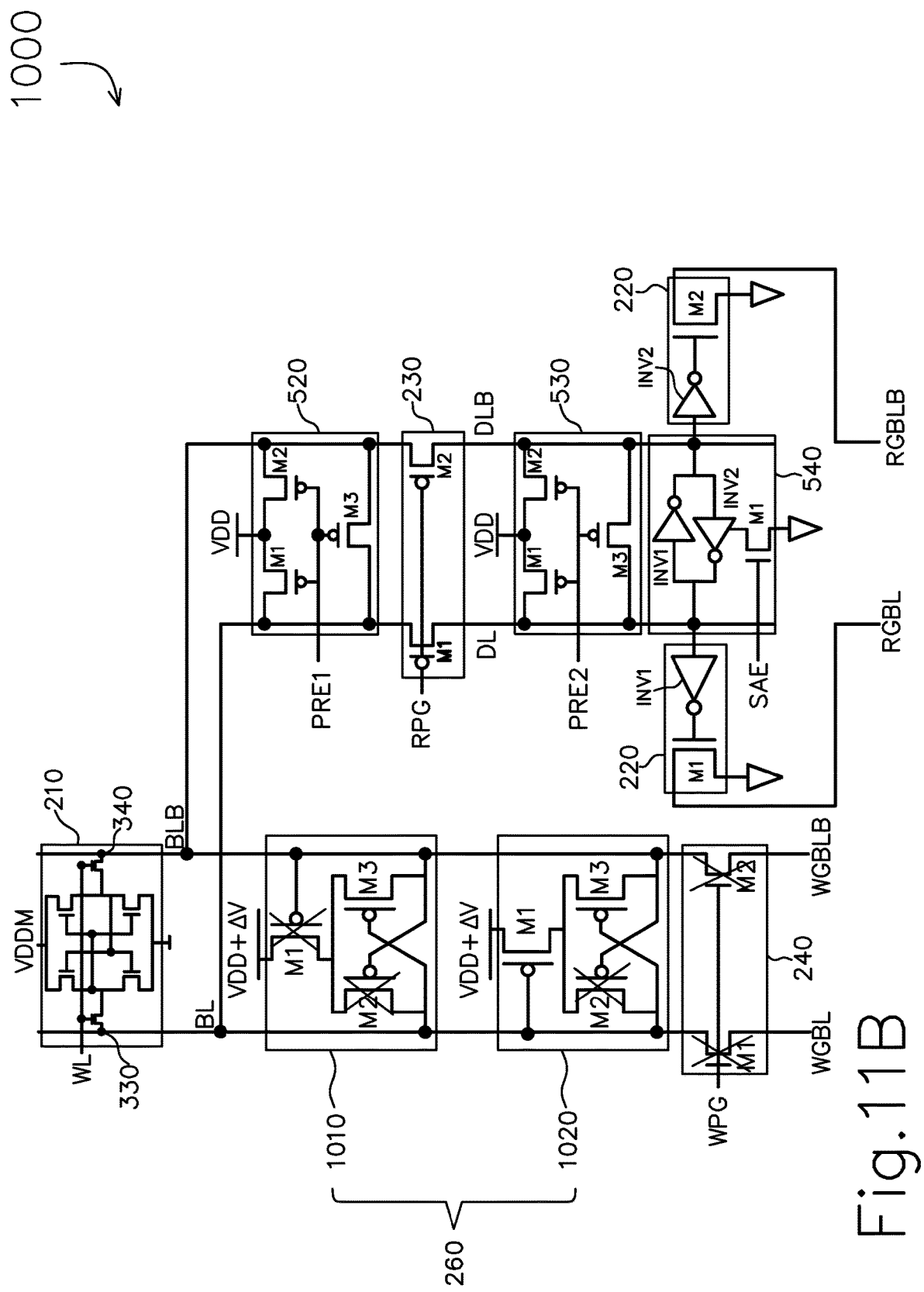

Schematic circuit diagrams of the memory device 1000 during a read operation thereof, according to some embodiments, are illustrated in FIGS. 11A and 11B. Prior to a read operation, voltages at the enable nodes (PRE1, PRE2) are at the low voltage level and the MOSFETs (M1, M2, M3) of the pre-charging circuits 520, 530 are turned on. As a result, the local bit lines (BL, BLB) and the data lines (DL, DLB) are pre-charged to the high voltage level and levels of voltages thereon are equalized, at substantially the same time. Subsequently, when the voltages at the enable nodes (PRE1, PRE2) transition from the low voltage level to the high voltage level, the MOSFETs (M1, M2, M3) of the pre-charging circuits 520, 530 are turned off. As a result, the local bit lines (BL, BLB) and the data lines (DL, DLB) are left floating at the high voltage level.

In an alternative embodiment, prior to a read operation of the memory device 1000, levels of voltages on the local bit lines (BL, BLB) and/or levels of voltages on the data lines (DL, DLB) are equalized first and then the local bit lines (BL, BLB) and/or the data lines (DL, DLB) are pre-charged to the high voltage level, thereby minimizing power consumption of the memory device 1000.

As illustrated in FIG. 11A, during a read operation, in which bits '1' and '0' are respectively latched/stored in the memory cell nodes 330, 340 of the memory cell 210, when a voltage at the enable node (RPG) transitions from the high voltage level to the low voltage level, the MOSFETs (M1, M2) of the pass gate circuit 230 are turned on and connect electrically and respectively the local bit lines (BL, BLB) to the data lines (DL, DLB). At this time, the word line (WL) is activated. As a result, the bits '1' and '0' are respectively transferred from the local bit lines (BL, BLB) to the data lines (DL, DLB). This pulls the data line (DLB) towards the low voltage level. As this occurs, the cross-coupled MOSFET pair 1010 pulls the data line (DL), via the local bit line (BL), towards the level of the high speed voltage (VDD+ ΔV). The MOSFET (M3) of the cross-coupled MOSFET pair 1010 and the MOSFETs (M1, M3) of the cross-coupled MOSFET pair 1020 are turned off and are therefore crossed out in FIG. 11A. The pass gate circuit 240 is not in operation and the MOSFETs (M1, M2) thereof are also crossed out in FIG. 11A.

When the sensing circuit 540 senses that a difference between levels of voltages on the data lines (DL, DLB) exceeds a threshold level, a voltage at the enable node (SAE) transitions from the low voltage level to the high voltage level. This pulls the data line (DLB) to the low voltage level. Thereafter, the low level voltage is transferred by the output circuit 220 from the data line (DLB) to the global bit line (RGBLB), whereby complementary bits of data are read from the memory cell 210.

As illustrated in FIG. 11B, during another read operation, in which bits '0' and '1' are respectively stored in the memory cell nodes 330, 340 of the memory cell 210, when a voltage at the enable node (RPG) transitions from the high voltage level to the low voltage level, the MOSFETs (M1, M2) of the pass gate circuit 230 are turned on and connect electrically and respectively the local bit lines (BL, BLB) to the data lines (DL, DLB). At this time, the word line (WL) is activated. As a result, the bits '0' and '1' are respectively transferred from the local bit lines (BL, BLB) to the data lines (DL, DLB). This pulls the data line (DL) towards the low voltage level. As this occurs, the cross-coupled MOSFET pair 1020 pulls the data line (DLB), via the local bit line (BLB) towards the level of the high speed voltage (VDD+ ΔV). The MOSFET (M2) of the cross-coupled MOSFET pair 1020 and the MOSFETs (M1, M2,) of the cross-coupled MOSFET pair 1010 are turned off and are therefore crossed out in FIG. 11B. The pass gate circuit 240 is not in operation and the MOSFETs (M1, M2) thereof are also crossed out in FIG. 11B.

When the sensing circuit 540 senses that a difference between levels of voltages on the data lines (DL, DLB) exceeds a threshold level, a voltage at the enable node (SAE) transitions from the low voltage level to the high voltage level. This pulls the data line (DL) to the low voltage level. Thereafter, the low level voltage is transferred by the output circuit 220 from the data line (DL) to the global bit line (RGBL), whereby complementary bits of data are read from the memory cell 210.

In an alternative embodiment, instead of to the local bit lines (BL, BLB), the cross coupled circuit 260 of the memory device 1000 is connected to the data lines (DL, DLB) and is therefore configured to pull the data line (DL/DLB) to the level of the high speed voltage (VDD+ ΔV).

Figure 12A:
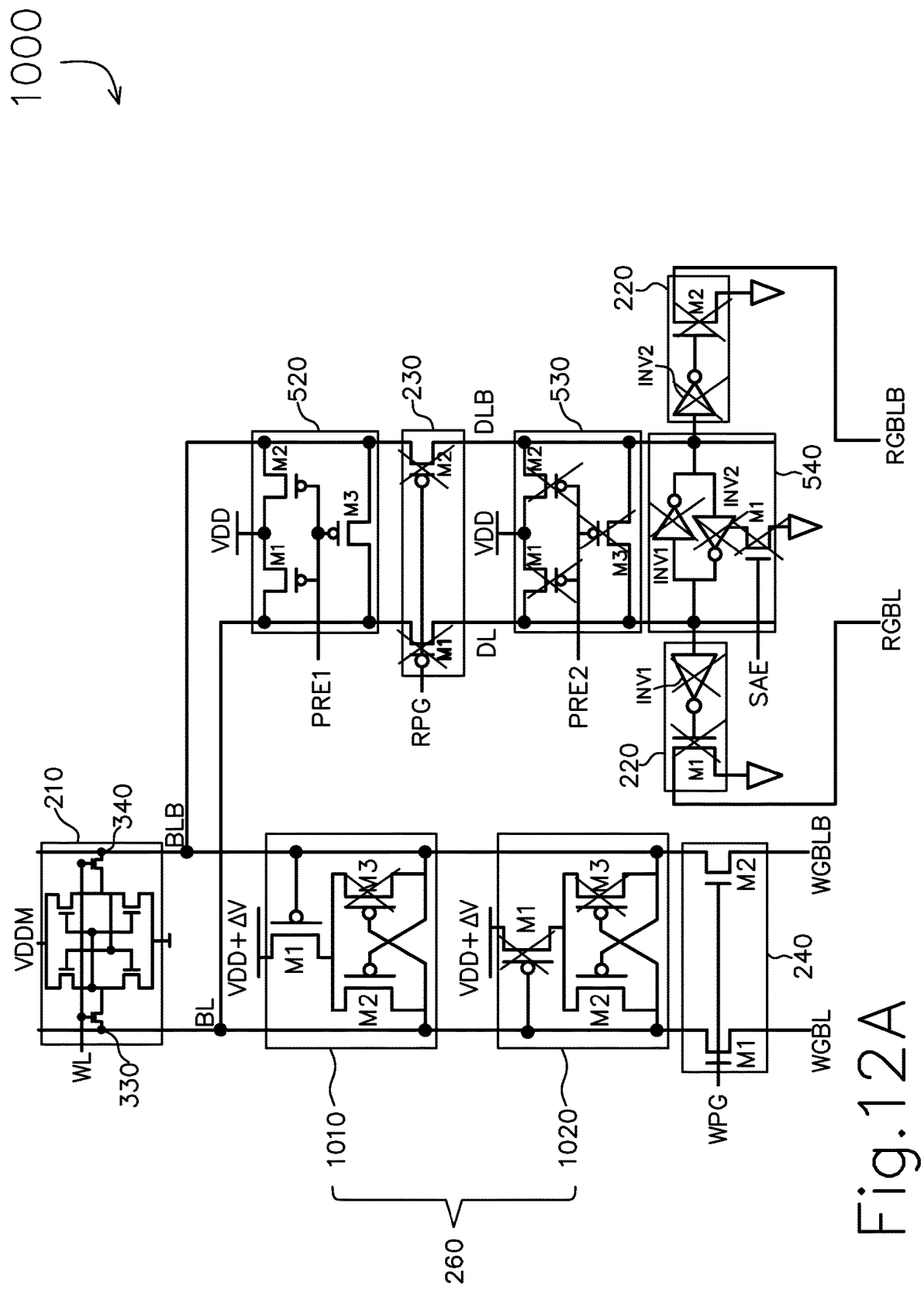
FIGS. 12A and 12B are schematic circuit diagrams of the memory device of FIG. 10 during a write operation thereof according to some embodiments.
Figure 12B:
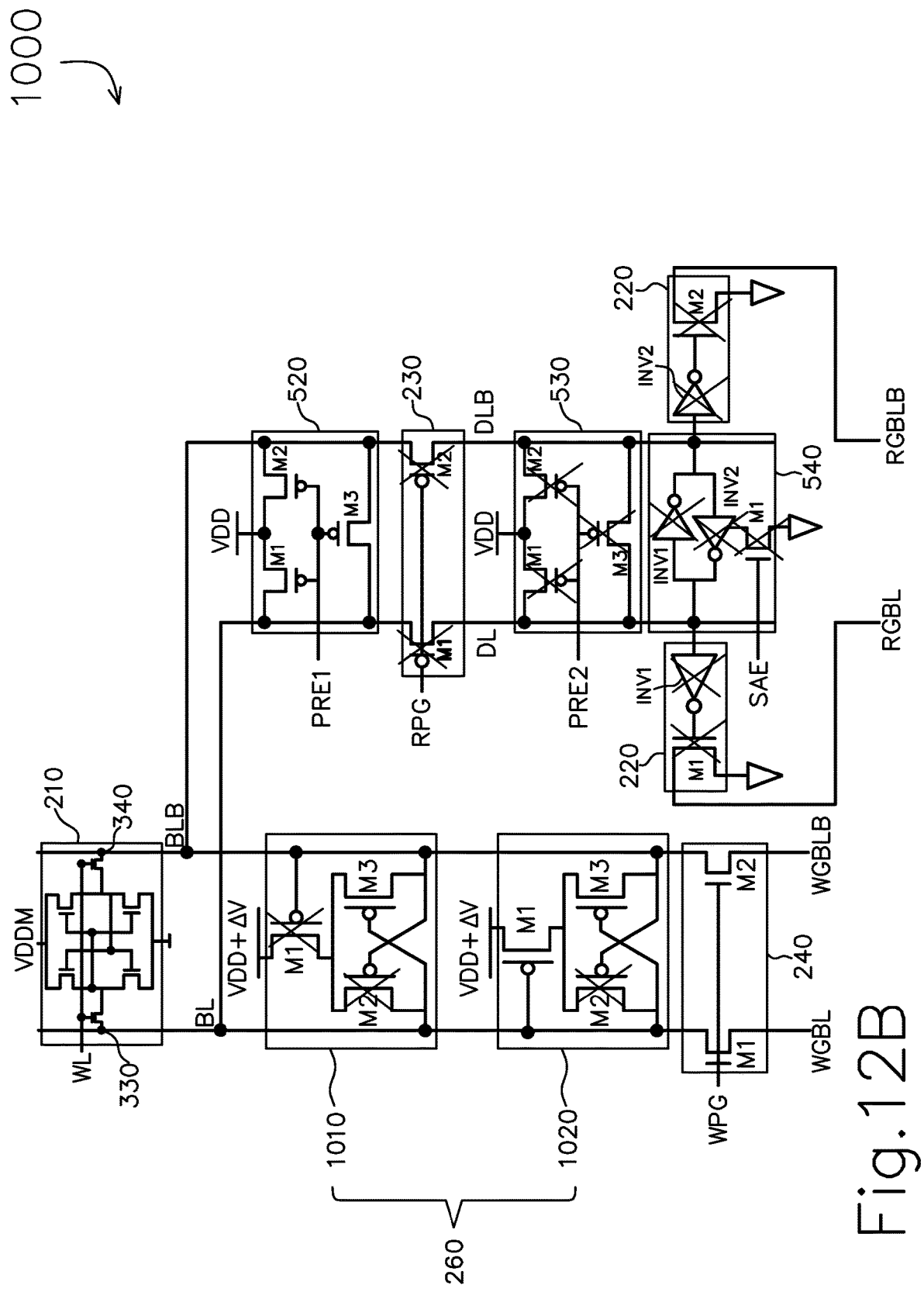

Schematic circuit diagrams of the memory device 1000 during a write operation thereof, according to some embodiments, are illustrated in FIGS. 12A and 12B. Prior to a write operation, a voltage at the enable node (PRE1) is at the low voltage level and the MOSFETs (M1, M2, M3) of the pre-charging circuit 520 are turned on. As a result, the local bit lines (BL, BLB) are pre-charged to the high voltage level and levels of voltages thereon are equalized, at substantially the same time. Subsequently, when the voltage at the enable node (PRE1) transitions from the low voltage level to the high voltage level, the MOSFETs (M1, M2, M3) of the pre-charging circuit 520 are turned off. As a result, the local bit lines (BL, BLB) are left floating at the high voltage level.

In an alternative embodiment, prior to a write operation of the memory device 1000, levels of voltages on the local bit lines (BL, BLB) are equalized first and then the local bit lines (BL, BLB) are pre-charged to the high voltage level, thereby minimizing power consumption of the memory device 1000.

As illustrated in FIG. 12A, during a write operation, in which bits '1' and '0' are respectively on the global bit lines (WGBL, WGBLB), when a voltage at the enable node (WPG) transitions from the low voltage level to the high voltage level, the MOSFETs (M1, M2) of the pass gate circuit 240 are turned on and connect respectively and electrically the local bit lines (BL, BLB) to the global bit lines (WGBL, WGBLB). As a result, the bits '1' and '0' are respectively transferred from the global bit lines (WGBL, WGBLB) to the local bit lines (BL, BLB). This pulls the local bit line (BLB) towards the low voltage level. As this occurs, the cross-coupled MOSFET pair 1010 pulls the local bit line (BL) towards the level of the high speed voltage (VDD+ΔV), thereby enhancing writing of the memory device 1000. The MOSFET (M3) of the cross-coupled MOSFET pair 1010 and the MOSFETs (M1, M3) of the cross-coupled MOSFET pair 1020 are turned off and are therefore crossed out in FIG. 12A. The output circuit 220, the pass gate circuit 230, the pre-charging circuit 530, and the sensing circuit 540 are not in operation and the MOSFETs/inverters thereof are also crossed out in FIG. 12A. At this time, when the word line (WL) is activated, complementary bits of data are written to the memory cell 210.

As illustrated in FIG. 12B, during another write operation, in which bits '0' and '1' are respectively on the global bit lines (WGBL, WGBLB), when a voltage at the enable node (WPG) transitions from the low voltage level to the high voltage level, the MOSFETs (M1, M2) of the pass gate circuit 240 are turned on and connect respectively and electrically the local bit lines (BL, BLB) to the global bit lines (WGBL, WGBLB). As a result, the bits '0' and '1' are respectively transferred from the global bit lines (WGBL, WGBLB) to the local bit lines (BL, BLB). This pulls the local bit line (BL) towards the low voltage level. As this occurs, the cross-coupled MOSFET pair 1020 pulls the local bit line (BLB) towards the level of the high speed voltage (VDD+ΔV), thereby enhancing writing of the memory device 1000. The MOSFET (M2) of the cross-coupled MOSFET pair 1020 and the MOSFETs (M1, M2,) of the cross-coupled MOSFET pair 1010 are turned off and are therefore crossed out in FIG. 12B. The output circuit 220, the pass gate circuit 230, the pre-charging circuit 530, and the sensing circuit 540 are not in operation and the MOSFETs/inverters thereof are also crossed out in FIG. 12B. At this time, when the word line (WL) is activated, complementary bits of data are written to the memory cell 210.

It will be appreciated that, after reading this disclosure, other configurations for the sensing circuit 540 of the memory device 1000 are possible so long as they achieve the intended purpose described herein. For example, instead of a differential sense amplifier, the sensing circuit 540 of the memory device 1000 may be a single-ended sense amplifier, such as the single-ended sense amplifier 910.

From the above description, the memory device of the present disclosure includes a memory cell, complementary local bit lines, complementary data lines, a pre-charging circuit, a sensing circuit, and a cross coupled circuit. Prior to a read operation of the memory device, the pre-charging circuit pre-charges the data lines to a high voltage level. During a read operation of the memory device, bits '0' and '1' of data stored in the memory cell are respectively transferred to the data lines via the local bit lines. This pulls one of the data lines towards a low voltage level. As this occurs, the cross coupled circuit pulls the other of the data lines, e.g., via one of the local bit lines, towards a level of a high speed voltage higher than the high voltage level. As such, the sensing circuit can quickly sense a difference between levels of voltages on the data lines, whereby complementary bits of data are read from the memory cell at a high speed.

In an exemplary embodiment, a module for a memory device comprises a high speed voltage node, a pre-charging circuit, and a cross coupled circuit. The pre-charging circuit includes a pre-charger configured to pre-charge complementary first and second lines of the memory device to a level of a source voltage. The cross coupled circuit is configured to pull one of the first and second lines to a level of a high speed voltage at the high speed voltage node higher than the level of the source voltage.

In another exemplary embodiment, a memory device comprises complementary first and second lines, a memory cell that is coupled to the first and second lines, and a module that includes a pre-charging circuit, and a cross coupled circuit. The pre-charging circuit includes a pre-charger configured to pre-charge the first and second lines to a level of a source voltage. The cross coupled circuit is configured to pull one of the first and second lines to a level of a high speed voltage higher than the level of the source voltage and includes a transistor that has a bulk and a gate terminal coupled to the bulk.

In another exemplary embodiment, a memory device comprises complementary first and second lines, a memory cell that is coupled to the first and second lines, and a module that includes a high speed voltage node, a pre-charging circuit, and a cross coupled circuit. The pre-charging circuit includes a pre-charger configured to pre-charge the first and second lines to a level of a source voltage. The cross coupled circuit is configured to pull one of the first and second lines to a level of a high speed voltage higher than the level of the source voltage and includes a pair of transistors that have different switching speeds.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a first line, wherein the first line is complementary to a second line;
   a voltage generator configured to generate a first supply voltage, a second supply voltage and a third supply voltage, wherein the third supply voltage is lower than the second supply voltage, wherein the voltage generator further comprises a transistor structure with a plurality of transistors electrically connected in parallel from the first supply voltage to a supply output node that provides the second supply voltage;
   a memory cell electrically coupled to the first and second lines, wherein the memory cell further comprises two cross-coupled transistor strings connected from the first supply voltage to a ground voltage;
   a pre-charger with a first pre-charger transistor cross-coupled to a second pre-charger transistor, wherein the pre-charger is configured to pre-charge the first and second lines to a level of a source voltage;
   a cross coupled circuit configured to pull one of the first and second lines to a level of a pull-up voltage that is higher than the level of the source voltage, wherein the cross coupled circuit includes a first transistor that has a first bulk and a gate terminal connected to the first bulk;
   complementary data lines;
   a pass gate circuit configured to electrically couple the first line and the second line to the data lines respectively; and
   a sensing circuit configured to pull one of the data lines to a level of a reference voltage lower than the level of the third voltage.

2. The memory device of claim 1, wherein in the cross coupled circuit, the second transistor has a second bulk separate from the first bulk, and a gate terminal coupled to the second bulk thereof.

3. The memory device of claim 1, wherein the sensing circuit includes a differential sense amplifier.

4. The memory device of claim 1, further comprising:
   complementary local bit lines; and wherein the pass gate circuit is configured to couple electrically and respectively the first and second lines to the local bit lines.

5. The memory device of claim 2, wherein each of the first and second transistors has a first source/drain connected to a respective one of the lines and to the gate of the other transistor.

6. The memory device of claim 1, wherein the memory cell has first and second cross-coupled transistor strings that are connected to a memory-cell supply voltage that is higher than the pull-up voltage.

7. The memory device of claim 1, wherein the pass gate circuit is configured to couple electrically and respectively the first and second lines to complementary local bit lines of the memory device.

8. A memory device comprising:
complementary first and second lines;
a voltage generating circuit configured to provide a first supply voltage, a second supply voltage lower than the first supply voltage, and a third supply voltage lower than the second supply voltage, and includes a transistor structure comprising transistors connected in parallel from the first supply voltage to a supply output node that provides the second supply voltage;
a memory cell connected to first and second lines and including two cross-coupled transistor strings connected from the first supply voltage to a ground voltage;
a pre-charger including first and second pre-charger transistors connected from the third supply voltage to the first and second lines respectively and whose gates are connected together;
a cross coupled circuit including first and second cross-coupled transistors that are connected from the second supply voltage to the first and second lines respectively and whose gates are connected to the second and first lines respectively;
complementary data lines;
a pass gate circuit configured to couple electrically and respectively the first and second lines to the data lines; and
a sensing circuit configured to pull one of the data lines to a level of a reference voltage lower than the level of the third voltage.

9. The memory device of claim 8, wherein the first cross-coupled transistor has a first bulk and a gate terminal coupled to the first bulk, and the second cross-coupled transistor has a second bulk separate from the first bulk and a gate terminal coupled to the second bulk.

10. The memory device of claim 9, wherein:
each of the cross-coupled transistors further has a first source/drain terminal;
the first source/drain terminal of the first cross-coupled transistor and the gate terminal of the second cross-coupled transistor are coupled to each other and to the first line; and
the first source/drain terminal of the second cross-coupled transistor and the gate terminal of the first cross-coupled transistor are coupled to each other and to the second line.

11. The memory device of claim 9, wherein each of the first and second cross-coupled transistors further has a second source/drain terminal configured to be coupled to the second supply voltage.

12. The memory device of claim 8, further comprising:
an equalizer configured to equalize levels of voltages on the first and second lines;
wherein the pre-charger and the equalizer are coupled to each other and to an enable node configured to receive a voltage level for enabling operations of the pre-charger and the equalizer.

13. The memory device of claim 8, wherein the sensing circuit includes a differential sense amplifier.

14. A module for a memory device, comprising:
a memory cell including first and second cross-coupled transistor strings, each transistor string including two memory cell transistors connected in series from a first supply voltage to a ground voltage, with gates of the first and second transistor string connected respectively to complementary first and second lines;
a cross coupled circuit including first and second cross-coupled transistors that are connected from a second supply voltage, lower than the first supply voltage, to the first and second lines respectively and whose gates are connected to the second and first lines respectively;
a pre-charger configured to pre-charge the first and second lines and including first and second pre-charger transistors connected from a third supply voltage, lower than the second supply voltage, to the first and second lines respectively;
a pass gate circuit configured to couple electrically and respectively the first and second lines to complementary data lines of the memory device; and
a sensing circuit configured to pull one of the data lines to a level of a reference voltage lower than the third supply voltage.

15. The module of claim 14, wherein the first cross-coupled transistor has a first bulk and a gate terminal coupled to the first bulk, and the second cross-coupled transistor has a second bulk separate from the first bulk and a gate terminal coupled to the second bulk.

16. The module of claim 14, further comprising an enable node and an equalizer configured to equalize levels of voltages on the first and second lines, wherein the pre-charger and the equalizer are coupled to the enable node.

17. The module of claim 14, further comprising first and second enable nodes and an equalizer configured to equalize levels of voltages on the first and second lines, wherein the pre-charger and the equalizer are respectively coupled to the first and second enable nodes.

18. The memory device of claim 14, wherein the first supply voltage is about 1.5V, the second supply voltage is about 1.2V, and the third supply voltage is about 1.0V.

19. The module of claim 14, wherein the sensing circuit includes a differential sense amplifier.

* * * * *

UNITED STATES PATENT AND TRADEMARK OFFICE
CERTIFICATE OF CORRECTION

PATENT NO. : 10,614,878 B2
APPLICATION NO. : 15/273745
DATED : April 7, 2020
INVENTOR(S) : Hua-Hsin Yu and Hau-Tai Shieh Page 1 of 1

It is certified that error appears in the above-identified patent and that said Letters Patent is hereby corrected as shown below:

On the Title Page

Item (54) and In the Specification, Column 1, Lines 1-3, should read:
HIGH SPEED SRAM DEVICE WITH CROSS COUPLED BIT LINE CHARGING CIRCUIT AND VOLTAGE GENERATOR Signed and Sealed this
Tenth Day of November, 2020

Andrei Iancu
*Director of the United States Patent and Trademark Office*